(12) United States Patent
Guzek

(10) Patent No.: US 10,930,596 B2
(45) Date of Patent: Feb. 23, 2021

(54) EMBEDDED DIE ON INTERPOSER PACKAGES

(71) Applicant: Intel Corporation, Santa Clara, CA (US)

(72) Inventor: John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,944

(22) PCT Filed: Sep. 30, 2016

(86) PCT No.: PCT/US2016/054749
§ 371 (c)(1),
(2) Date: Feb. 25, 2019

(87) PCT Pub. No.: WO2018/063321
PCT Pub. Date: Apr. 5, 2018

(65) Prior Publication Data
US 2019/0189564 A1    Jun. 20, 2019

(51) Int. Cl.
*H01L 23/538* (2006.01)
*H01L 23/13* (2006.01)
(Continued)

(52) U.S. Cl.
CPC .......... *H01L 23/5389* (2013.01); *H01L 21/56* (2013.01); *H01L 21/568* (2013.01);
(Continued)

(58) Field of Classification Search
CPC ....... H01L 2924/00014; H01L 2924/00; H01L 2224/32225; H01L 2224/73265;
(Continued)

(56) References Cited

U.S. PATENT DOCUMENTS 8,810,024 B2 * 8/2014 Lin ..................... H01L 23/5389
257/698
2008/0029872 A1 2/2008 Hsu et al.
(Continued)

FOREIGN PATENT DOCUMENTS

WO    2018063321 A1    4/2018

OTHER PUBLICATIONS

PCT International Search Report and Written Opinion issued in PCT/US2016/054749 dated Jun. 28, 2017; 14 pages.
(Continued)

*Primary Examiner* — Jonathan Han
(74) *Attorney, Agent, or Firm* — Schwabe, Williamson & Wyatt, P.C.

(57) ABSTRACT

Integrated circuit (IC) packages having a through-via interposer with an embedded die, as well as related structures, devices, and methods, are disclosed herein. For example, in some embodiments, an IC package may include a through-via interposer with an embedded die, the through-via connections having front to back conductivity. In some embodiments, a die may be disposed on the back side of an IC package having a through-via interposer with an embedded die and may be electrically coupled to the embedded die. In some embodiments, a second IC package in a package-on-package (PoP) arrangement may be disposed on the back side of an IC package having a through-via interposer with an embedded die and may be electrically coupled to the conductive vias.

14 Claims, 15 Drawing Sheets

(51) Int. Cl.
  *H01L 21/56* (2006.01)
  *H01L 23/498* (2006.01)
  *H01L 25/07* (2006.01)
  *H01L 25/065* (2006.01)
  *H01L 23/48* (2006.01)
  H01L 23/31 (2006.01)

(52) U.S. Cl.
  CPC .............. *H01L 23/13* (2013.01); *H01L 23/48* (2013.01); *H01L 23/49816* (2013.01); *H01L 23/49833* (2013.01); *H01L 23/49838* (2013.01); *H01L 25/065* (2013.01); *H01L 25/0657* (2013.01); *H01L 25/07* (2013.01); *H01L 23/3128* (2013.01); *H01L 23/49827* (2013.01); *H01L 2224/16* (2013.01); *H01L 2225/06513* (2013.01); *H01L 2225/06517* (2013.01); *H01L 2924/18161* (2013.01)

(58) Field of Classification Search
  CPC ..... H01L 2224/48227; H01L 2924/181; H01L 2224/16225; H01L 2225/1058; H01L 23/49816; H01L 24/96; H05K 1/181; H05K 2201/10378; H05K 3/284
  USPC ......... 438/110, 126, 667; 257/774, E21.511, 257/E21.5
  See application file for complete search history.

(56) References Cited

U.S. PATENT DOCUMENTS

| | | | |
|---|---|---|---|
| 2011/0024916 A1* | 2/2011 | Marimuthu | H01L 23/3128 257/774 |
| 2013/0334696 A1 | 12/2013 | Malatkar | |
| 2014/0103527 A1* | 4/2014 | Marimuthu | H01L 23/3128 257/737 |
| 2015/0069595 A1 | 3/2015 | Chen et al. | |
| 2015/0072476 A1 | 3/2015 | Hu et al. | |
| 2015/0371947 A1* | 12/2015 | Chen | H01L 21/76898 257/774 |
| 2016/0118333 A1* | 4/2016 | Lin | H01L 25/16 257/773 |
| 2016/0225692 A1* | 8/2016 | Kim | H01L 23/42 |

OTHER PUBLICATIONS

Office Action from German Patent Application No. 112016007505.7, dated Jul. 24, 2020, 5 pgs.

* cited by examiner

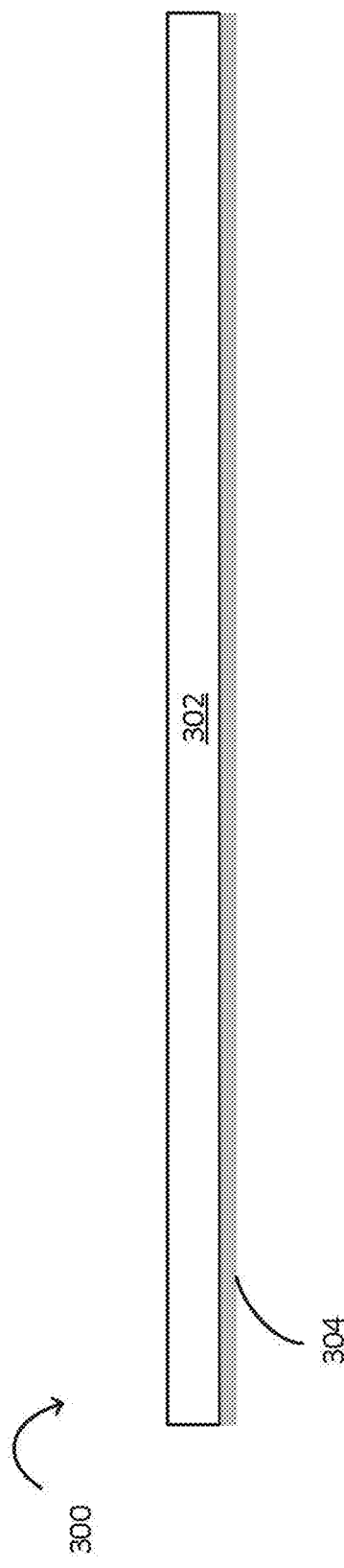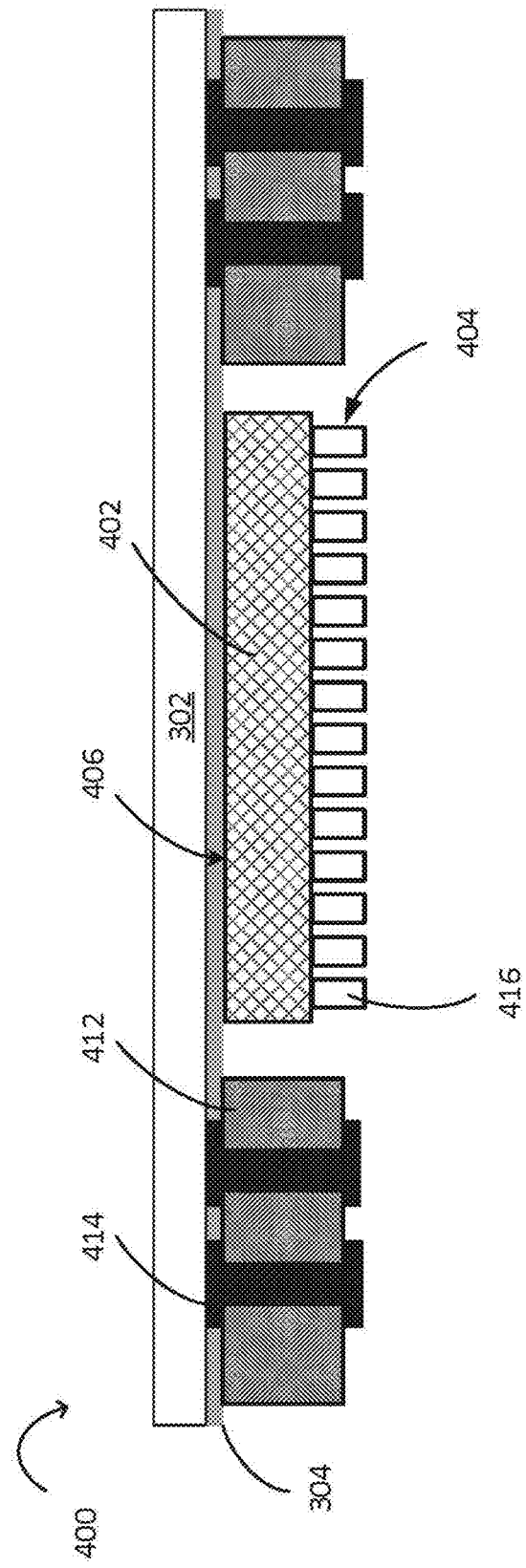

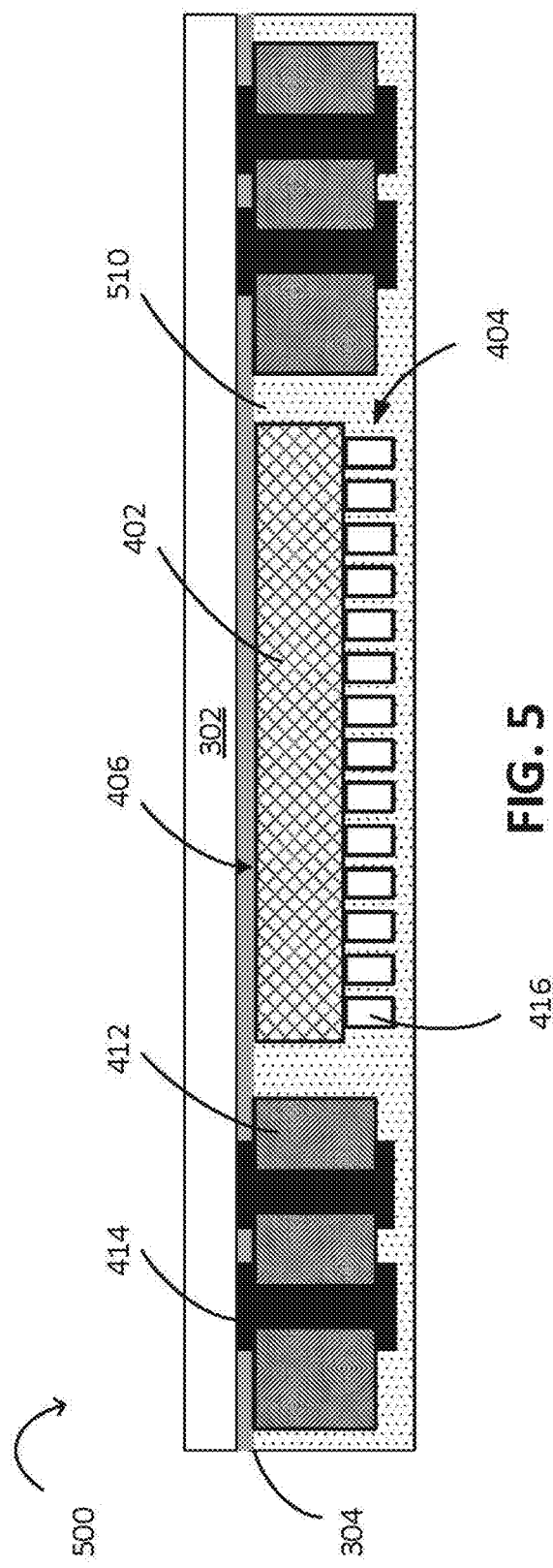
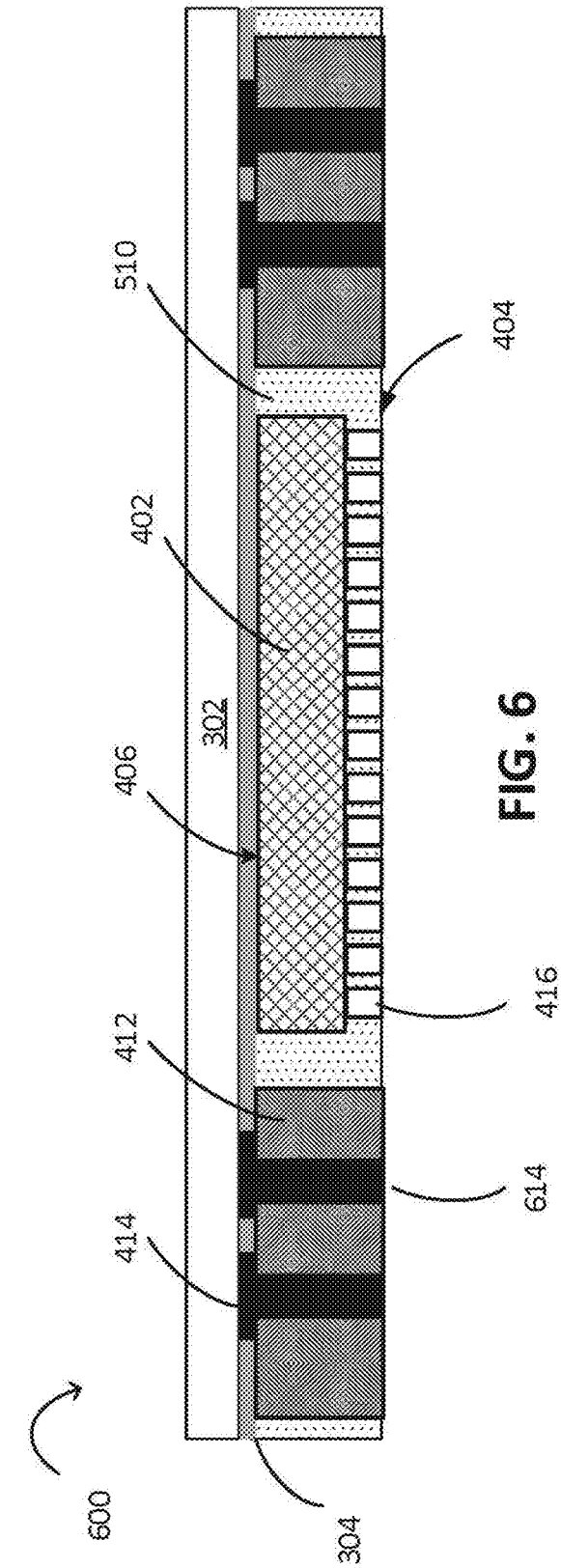

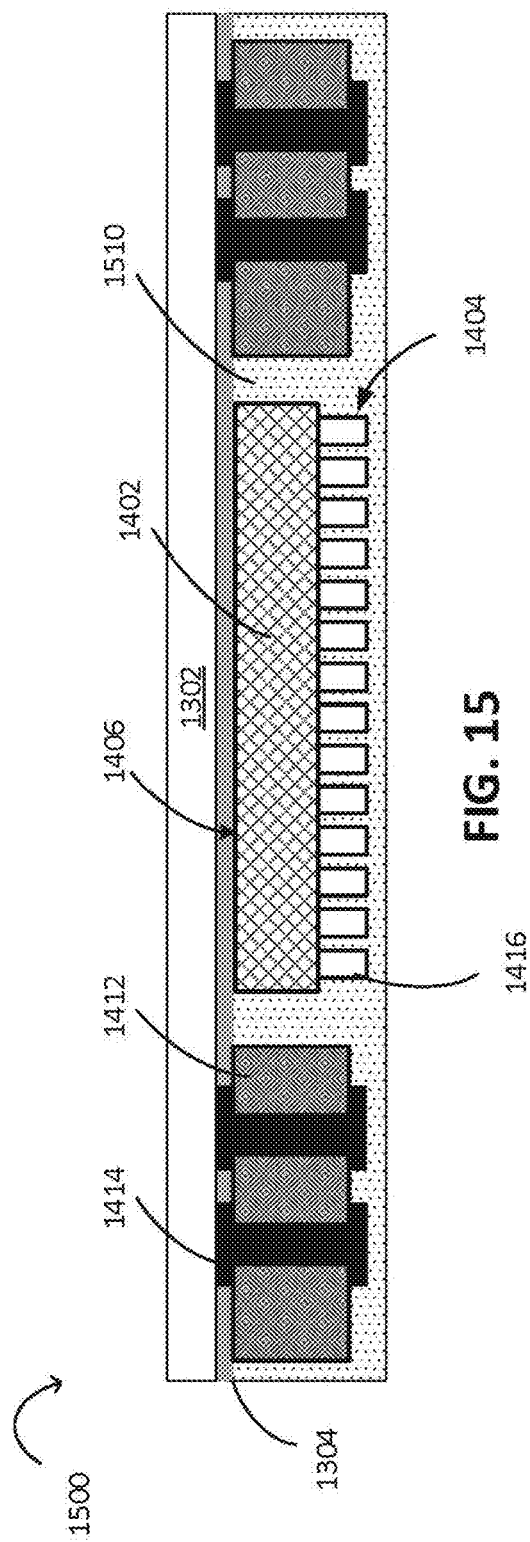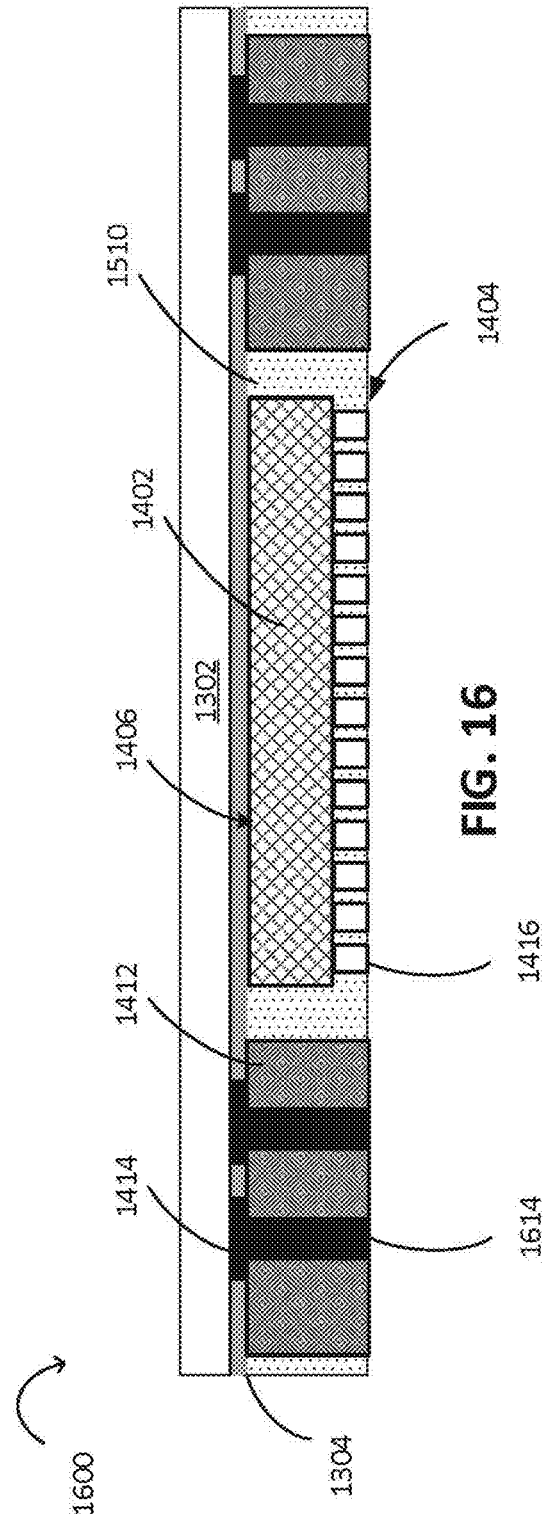

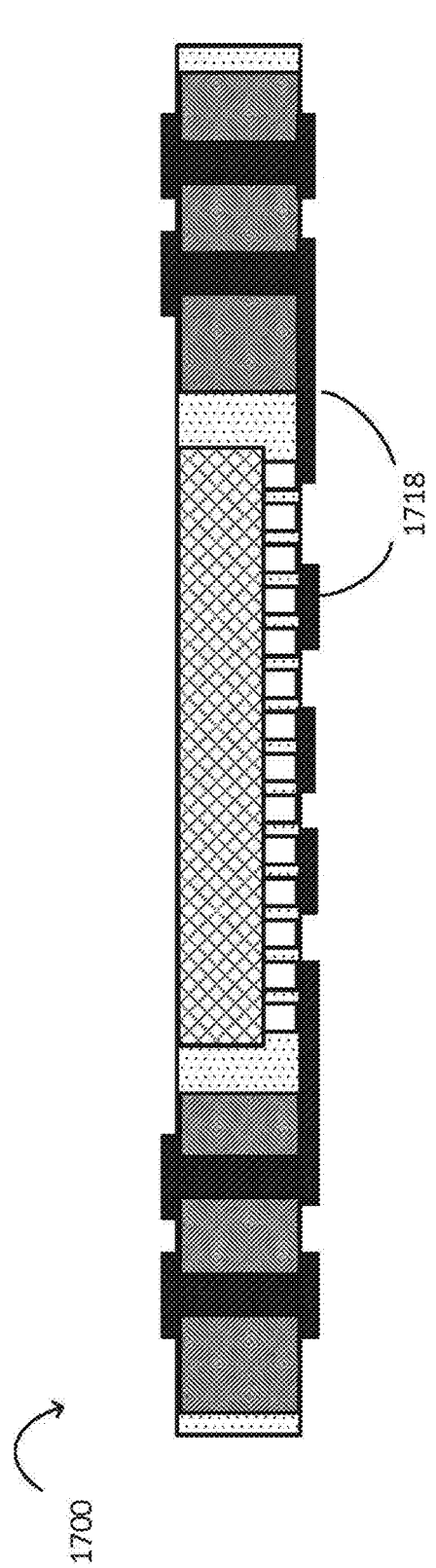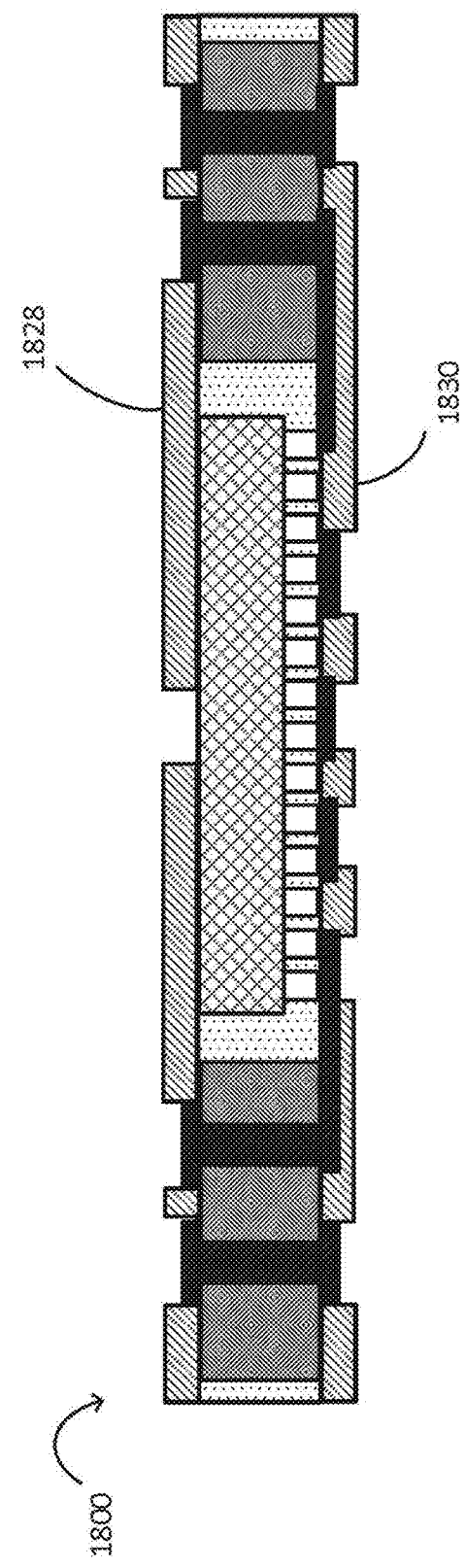

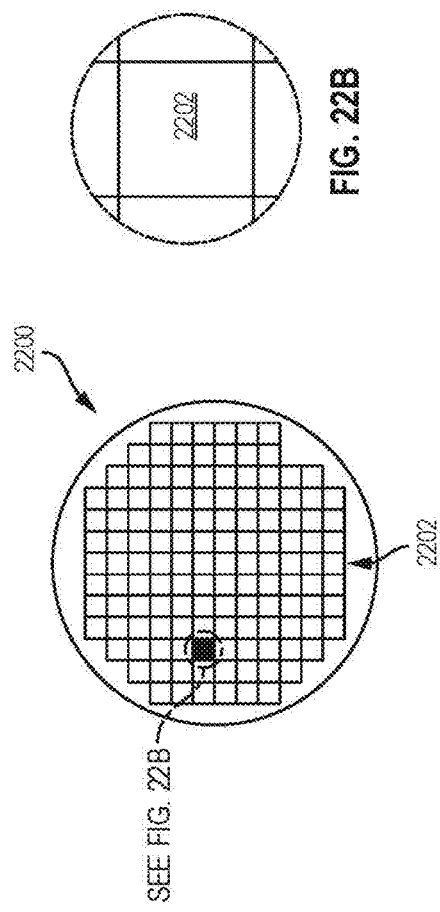
FIG. 22A
FIG. 22B
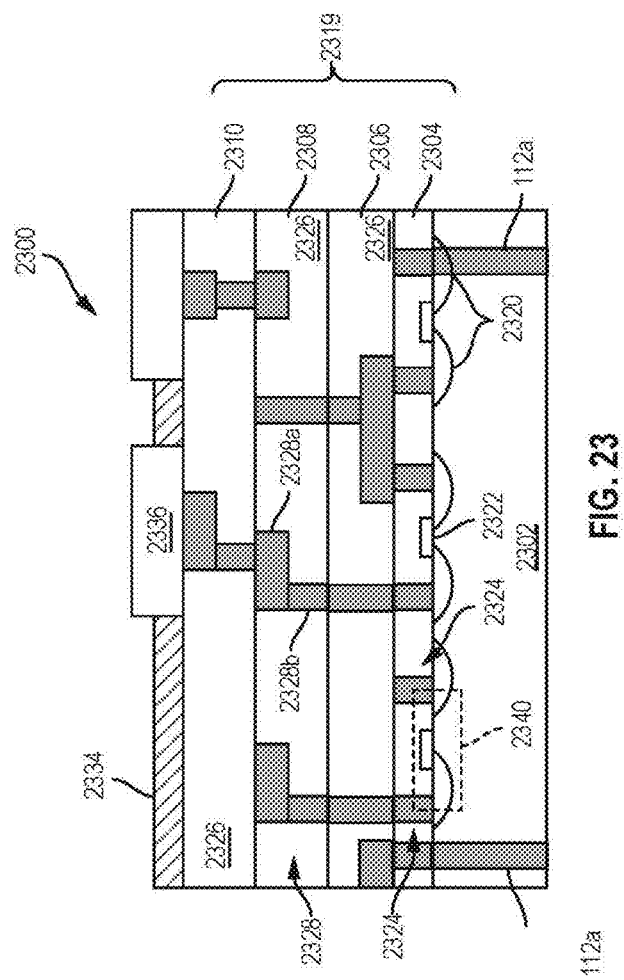
FIG. 23

EMBEDDED DIE ON INTERPOSER PACKAGES

CROSS REFERENCE TO RELATED APPLICATION

This Application is a 371 of PCT International Application No. PCT/US2016/054749, filed Sep. 30, 2016, entitled "EMBEDDED DIE ON INTERPOSER PACKAGES." The disclosure of this prior application is considered part of (and is incorporated by reference in) the disclosure of this application.

BACKGROUND

As electronic devices become smaller, reducing the footprint of these devices becomes important. One approach to reducing device footprints includes minimized warpage and reduced z-height in a package-on-package or stacking arrangement.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3-9 illustrate cross-sectional views of various stages in an example process for manufacturing a through-via interposer with an embedded die package, in accordance with various embodiments.

FIGS. 13-19 illustrate cross-sectional views of various stages in another example process for manufacturing a through-via interposer with an embedded die package, in accordance with various embodiments.

FIGS. 22A and 22B are top views of a wafer and dies that may be used with any of the embodiments of the packages disclosed herein.

FIG. 23 is a cross-sectional side view of an IC device that may be included in a die of an IC package having any of the embodiments of the packages disclosed herein.

DETAILED DESCRIPTION

Figure 1:
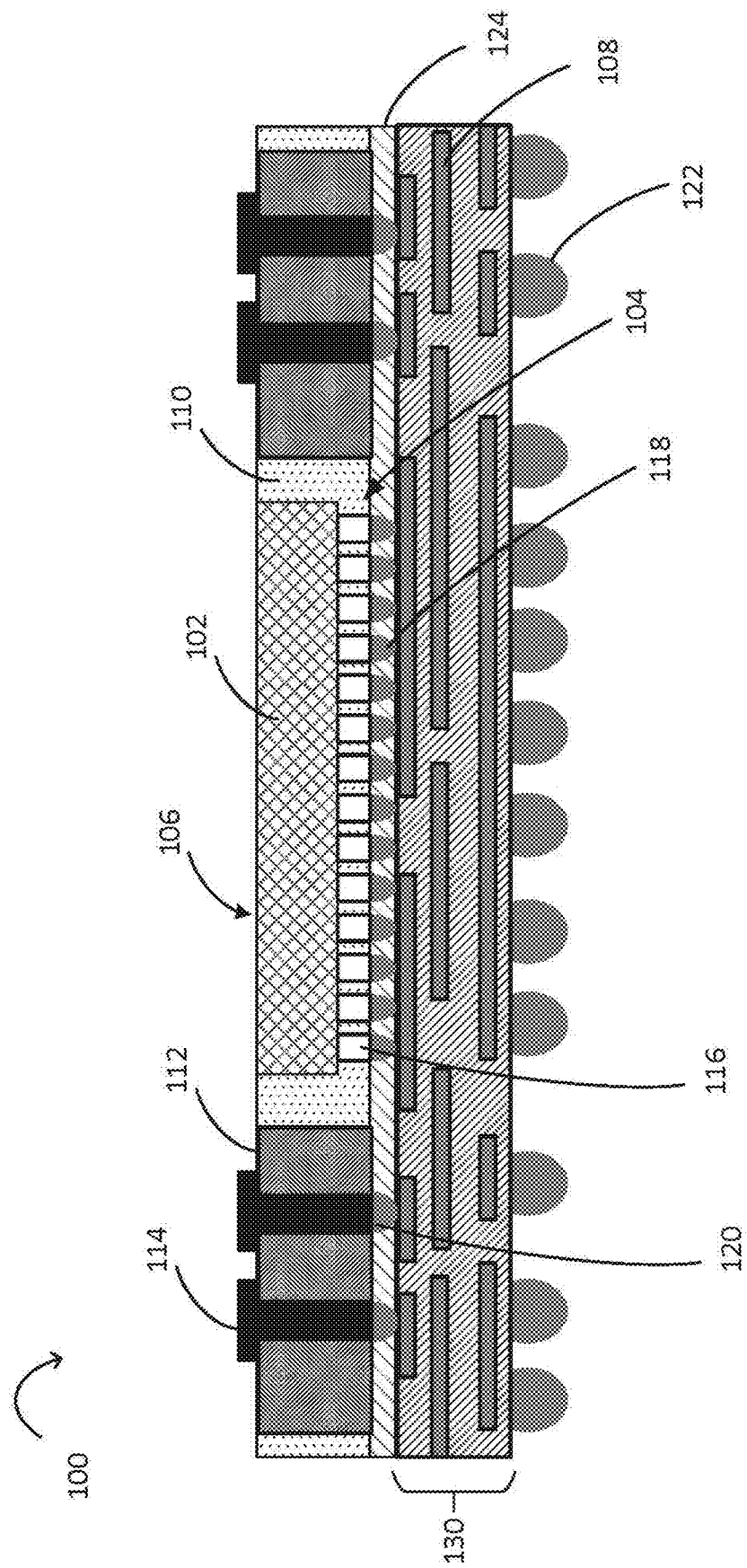
FIG. 1 is a cross-sectional side view of a through-via interposer with an embedded die package, in accordance with various embodiments.

Integrated circuit (IC) packages having a through-via interposer with an embedded die, as well as related structures, devices, and methods, are disclosed herein. For example, in some embodiments, an IC package may include a through-via interposer with an embedded die, the through-via connections having front to back conductivity. In some embodiments, an integrated circuit package having a through-via interposer with an embedded die may include a die disposed on the back side. In some embodiments, an integrated circuit package having a through-via interposer with an embedded die may include a package-on-package arrangement such that another integrated circuit package is disposed on the back side. In some embodiments, a plurality of dies and/or a plurality of integrated circuit packages may be stacked.

Various ones of the embodiments disclosed herein may provide extended conductive pathways (e.g., through-via interposer connections) with an embedded die to achieve back side package interconnects with minimized warpage and reduced z-height in package-on-package arrangements. In particular, some of the embodiments disclosed herein provide a through-via interposer with an embedded die package having a plurality of conductive vias that electrically connect the front side and back side of the package. One or more additional packages may be stacked on top of the exposed interconnects on the back side of the package to form a package-on-package assembly, or one or more additional dies may be coupled to the exposed interconnects on the back side using methods such as thermo-compression binding, mass reflow, surface activated bonding, or conductive adhesive bonding. Thus, various embodiments disclosed herein may provide an integrated circuit package having a through-via interposer with an embedded die, where the conductive vias may be used for conductive routing and contact pad placement of stacked dies and package-on-package arrangements.

Further, the through-via interposer with an embedded die provides a structure for minimizing warpage of the package. The interposer material may be selected to match the package substrate material and as well as minimize the coefficient of thermal expansion mismatch to the die material, which is, typically, silicon.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Common elements in different figures may be identified with a common label.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1 is a cross-sectional side view of a through-via interposer with an embedded die package, in accordance with various embodiments. The structure 100 may include an embedded die 102 having a device side 104 and an opposing back side 106, and a through-via interposer 112 with one or more conductive vias or pathways 114 through the interposer. As shown in FIG. 1, the interposer may have multiple conductive pathways. In some embodiments, the interposer may have hundreds of conductive pathways, including multiple layers of conductive wires or traces connected by multiple vias, such that multiple conductive pathways are made across the interposer layer. The conductive pathways on the interposer may be positioned to match contact pads of an electronic component, such as preassembled memory package, disposed on the backside of the embedded die.

In some embodiments, the interposer may be a square frame that surrounds die 102. In some embodiments, the interposer may be a plurality of bars that are positioned to create a frame around the die in any shape or form.

A mold compound 110 may surround the embedded die 102 and interposer 112. In some embodiments, the conductive pathways 114 may be in electrical contact with a device or interconnect, as discussed below with reference to FIG. 23. The conductive pathways 114 may extend to or past the back side surface 106 of the embedded die 102 so that the conductive pathways 114 are at least partially exposed at the back side surface. Thus, the structure 100 may provide interconnect opportunities at the back side surface 106 (via the exposed conductive pathways 114) and at the device side 104 of the die 102 (e.g., via exposed contact pads 116 or solder bumps 118, as known in the art and as discussed below with reference to FIG. 23).

The thickness of the mold compound 110 surrounding the embedded die 102 and interposer 112 may take any suitable value. In some embodiments, the thickness of the mold compound 110 is no greater than the thickness of the embedded die or interposer, which should be approximately the same thickness. In some embodiments, the thickness of the mold compound may be 0.1 millimeters or greater (e.g., 0.1-0.5 millimeters). In some embodiments, the thickness of the mold compound is minimized to reduce Z-height in a package-on-package arrangement.

The mold compound 110 may be formed of any suitable material, such as a polymer compound, a poly-resin mold compound, an elastomer mold compound, or any other suitable material. Other examples of mold compounds that may be included in the mold compound 110 may include plastic materials, thermosetting polymers, silicon composites, glass, epoxy resins, or fiberglass epoxy resins. The mold compound 110 may also include some filler material. For example, the mold compound 110 may include an epoxy resin with tiny grains (e.g., on the order of a micrometer) of fused silica or amorphous silicon dioxide. In some embodiments, the mold compound 110 may be a flexible material (e.g., to enable some wearable device applications). In some embodiments, the mold compound 110 may be a heat conductive (but electrically insulative) material that may allow the mold compound 110 to function as a heat spreader and spread heat generated by the die 102 to other areas of the structure 100 (or a larger package or assembly in which the structure 100 is included). In some embodiments, the mold compound is a fairly rigid material to provide additional structure and support to the interposer and embedded die. In some embodiments, the mold compound material may be selected to prevent warpage as well.

The conductive pathways 114 may be formed of one or more conductive materials, such as a metal (e.g., copper). Although the conductive pathways 114 illustrated in FIG. 1 are shown as having substantially parallel sidewalls, the conductive pathways 114 may have any profile (e.g., as dictated by the manufacturing operations used to form the conductive pathways 114). For example, in some embodiments, the conductive pathways may be tapered towards the front side 104 or the back side 106. In some embodiments, the width (e.g., the diameter) may differ along the length of the conductive pathway, where one portion may be wider (e.g., have a larger diameter) than another portion.

The interposer through-vias 114 and exposed contact pads 116 on the device side 104 of the die 102 may be coupled to the package substrate 130 via first level interconnects (FLI) 120, 118, respectively. The package substrate 130 may include electrical pathways 108 to route signals or power between the FLI 118, 120 and the second-level interconnects (SLI) 122, as known in the art. In some embodiments, the area between the interposer ring and embedded die 102, and the package substrate 130 may be filled with underfill 124.

Figure 2:
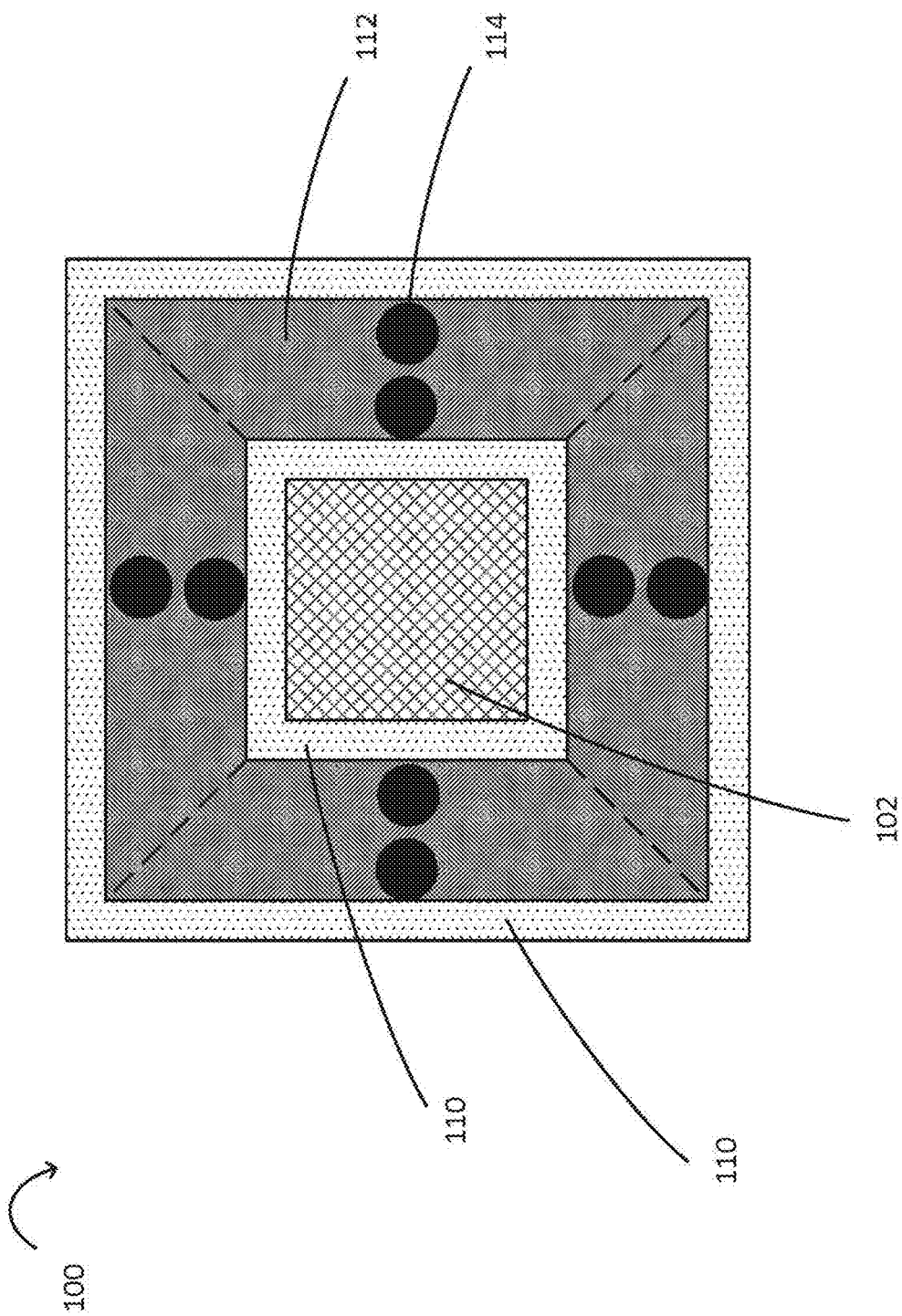
FIG. 2 is a top view of the package of FIG. 1, in accordance with various embodiments.

FIG. 2 is a top view of the through-via interposer with an embedded die package 100 of FIG. 1, in accordance with various embodiments. The embedded die 102 is surrounded by the interposer 112 and mold compound 110. The conductive pathways 114, which are the interposer through-vias, are exposed on the top surface (i.e., back side 106) to provide an electrical connection to the die 102 and/or to the package substrate from the top side.

FIGS. 3-9 illustrate cross-sectional views of various stages in an example process for manufacturing the through-via interposer with an embedded die package 100 of FIG. 1, in accordance with various embodiments. Although particular techniques are discussed below with reference to FIGS. 3-9, any suitable methods may be used to manufacture embodiments of the through-via interposer with embedded die package 100. Additionally, although operations discussed below refer to using solder bumps to form electrical connections, any other suitable techniques for electrically coupling may be used including, but are not limited to, thermocompression bonding, thermosonic bonding, or conductive adhesive attachment.

FIG. 3 illustrates an assembly 300 of a carrier or base plate 302 with releasable adhesive film 304. The carrier may be rigid to provide stability to the package during manufacturing. The carrier 302 may be of any suitable material, such as stainless steel, glass, silicon, fiber-glass reinforced epoxy, among others. The adhesive 304 may be any suitable adhesive that may provide for bonding during the manufacturing process and that may allow for removal at the end of the process. The adhesive should remain stable through processing, and release adhesion at the end of the process through exposure to high temperature, ultraviolet light, or mechanical peeling, among other techniques.

FIG. 4 illustrates an assembly 400 subsequent to placing die 402 and interposer 412 on adhesive side 304 of assembly 300. The back side 406 of die 402 is disposed against the adhesive side 304 of assembly 300 while the active side 404 with exposed contacts 416 is on the opposed (bottom) side. Through-via conductive pathways 414 may be formed using any suitable through-via formation techniques. In some embodiments, the conductive pathways 414 may be formed by drilling (e.g., laser drilling) through the interposer material to form openings that may then be filled with a conductive material (e.g., copper). In some embodiments, the conductive pathways 414 are pre-formed on the interposer 412. In some embodiments, the interposer 412 may be a frame that surrounds the die 402. In some embodiments, the interposer 412 may be individual bars that are placed to surround the die 402. The interposer may be any suitable material, such as low-CTE pre-impregnated material silicon, or glass. In some embodiments, the interposer thickness may be approximately the same thickness as the die, such that the exposed contacts on the die 416 and the bottom edge of the interposer are aligned.

FIG. 5 illustrates an assembly 500 subsequent to providing a mold compound 510 around the die 402, and the interposer 412. The mold compound may be added using any suitable technique, such as compression molding from the front side. Although the mold compound 510 is illustrated in FIG. 5 as fully covering the ends of the conductive vias 414, in some embodiments, the mold compound may leave the ends of the conductive vias 414 exposed on the bottom side.

FIG. 6 illustrates an assembly 600 subsequent to grinding the mold compound 510 (and the conductive material 414 and 416) of assembly 500 to expose the contact points of the die 416 and through-via interposer pads 614. Grinding operations may include mechanical grinding/polishing, mechanical cutting, and/or chemical mechanical polishing (e.g., CMP).

Figure 7:
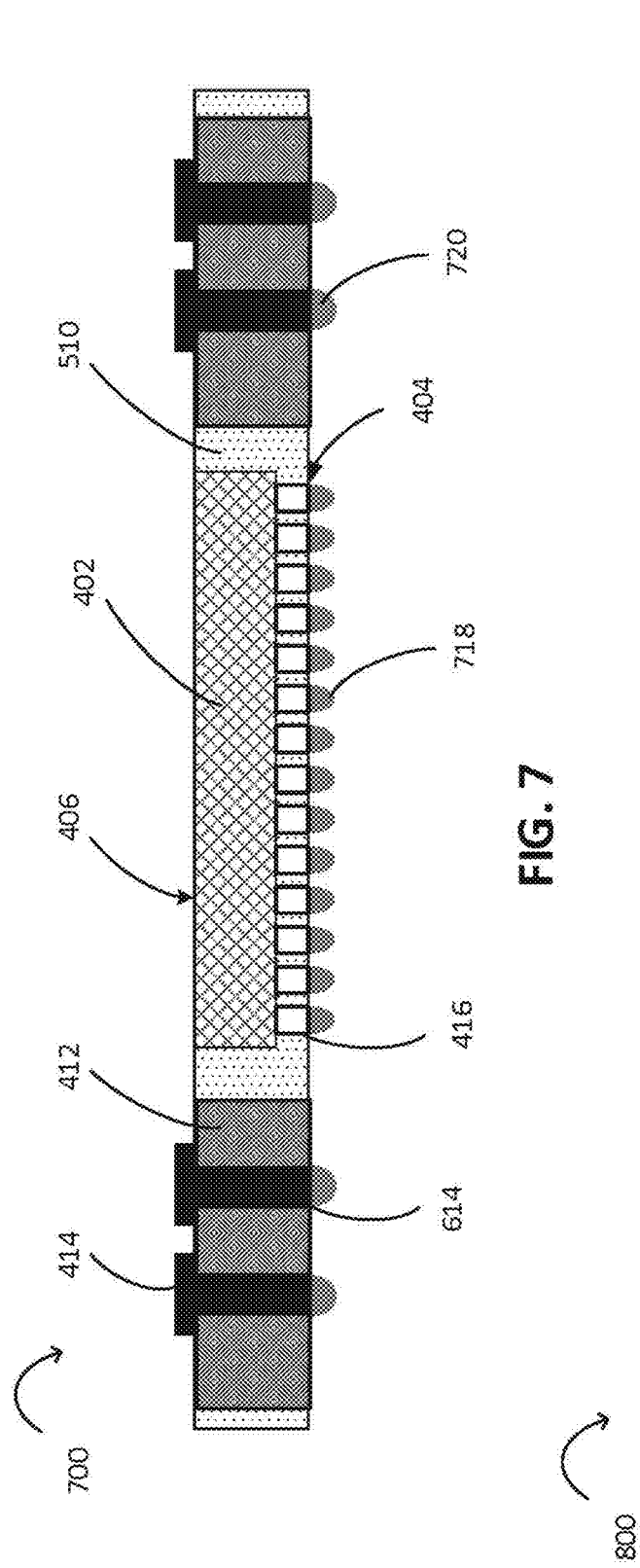

FIG. 7 illustrates an assembly 700 subsequent to removing the carrier 302 and adhesive 304 from the top side, and subsequent to placing and reflowing solder bumps 718, 720 on the die contacts 416 and the through-via interposer pads 614. The solder bumps may be added using any suitable technique, such as standard substrate microball technology, solder paste printing, or solder electroplating, among others.

Figure 8:
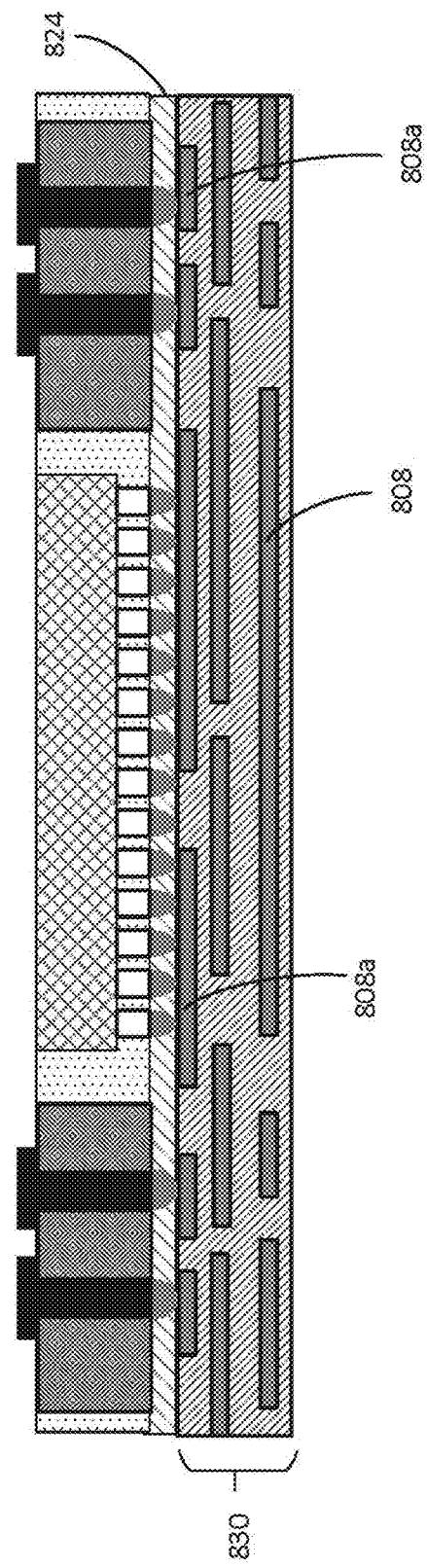

FIG. 8 illustrates an assembly 800 subsequent to packaging assembly 700 by mounting assembly 700 to package substrate 830. Assembly 700 may be mounted to package substrate 830 using any suitable technique, such as thermal compression bonding, mass reflow, thermosonic bonding, or conductive adhesive attachment. Package substrate 830 may be any suitable material, including the same low-CTE pre-impregnated material as the interposer, such that CTE mismatch to the silicon die material may be minimized. Package substrate 830 may be any suitable industry-standard substrate, such as core or coreless flip chip-chip scale package (FC-CSP). Package substrate 830 may include circuitry 808, such as traces or wires that connect horizontally and vertically through vias. Solder bumps 614, 718, 720 on embedded die assembly 700 may be matched to terminals 808a on the package substrate 830. In some embodiments, the conductive pathways 614 may be in contact with electrical routing pathways in the circuitry 808 so as to route signals from the front side 404 to the back side 406 of embedded die 402 without connecting through the die.

Assembly 800 may include underfill 824, which may be a mold compound or any other suitable material to fill the gap between the embedded die assembly 700 and the package substrate 830e. Underfill 824 may be applied using any suitable technique, such as transfer mold, capillary underfill, or epoxy flux as part of the TCB process.

Figure 9:
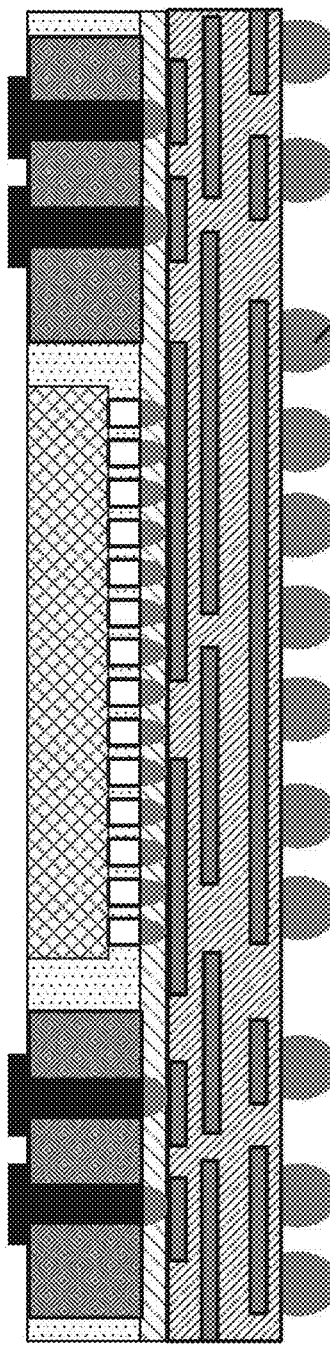

FIG. 9 illustrates an assembly 900 subsequent to placing and reflowing solder bumps 922 on the bottom side of packaging substrate of assembly 800 for mounting packaging assembly 900 onto a motherboard or other device.

Figure 10:
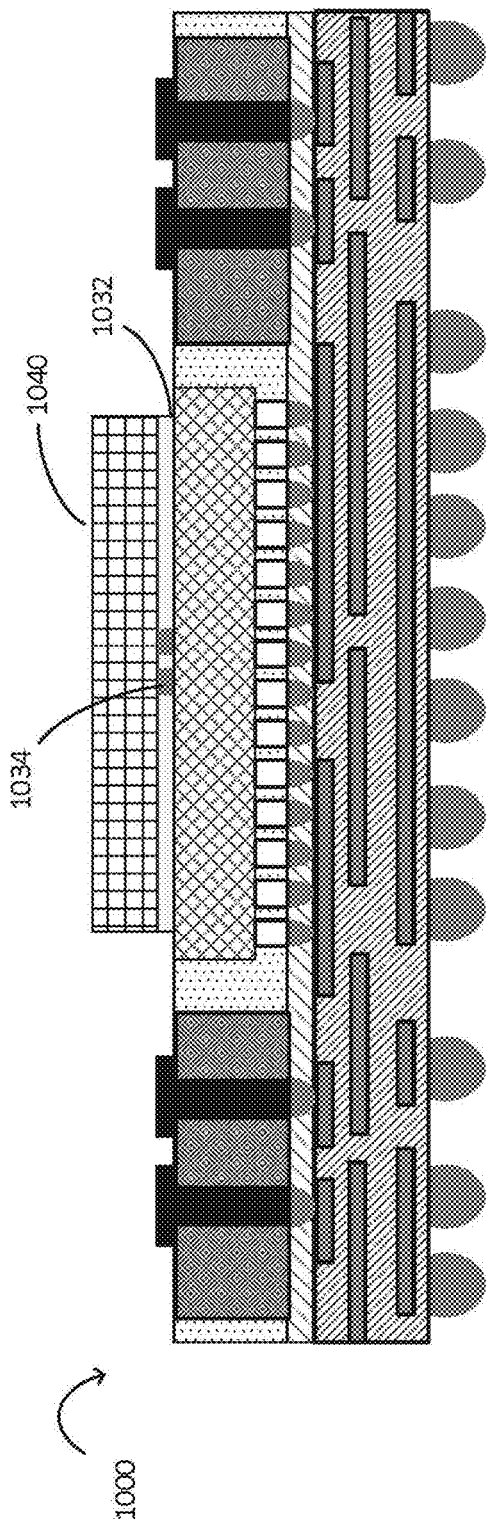
FIG. 10 is a cross-sectional side view of a stacked arrangement including a die disposed on a through-via interposer with an embedded die package, in accordance with various embodiments.

FIG. 10 illustrates an assembly 1000 subsequent to mounting or stacking a die 1040 on the back side of assembly 900. Embedded die 402 and die 1040 may be coupled and in electrical contact via conductive connection 1034 to enable communication between the components. In some embodiments, embedded die 402 and die 1040 may be coupled by other suitable mechanism (e.g., solder bonds, solder balls, or surface activated bonding). In some embodiments, assembly 1000 may include underfill 1032 to fill the gap between assembly 900 and die 1040 surfaces. Die 1040 may perform any suitable functionality, and may include processing devices, memory, communications devices, sensors, or any other computing components or circuitry. For example, die 1040 may be DRAM, flash memory, modem, processor, or radio frequency components, among others. In some embodiments, multiple dies may be coupled to the back side of assembly 900. In some embodiments, multiple dies are stacked and electrically coupled one to the other. In some embodiments, the multiple dies may be configured such that one die is coupled to and in electrical contact with the embedded die, and the other die is coupled to and in electrical contact with the interposer vias.

Figure 11A:
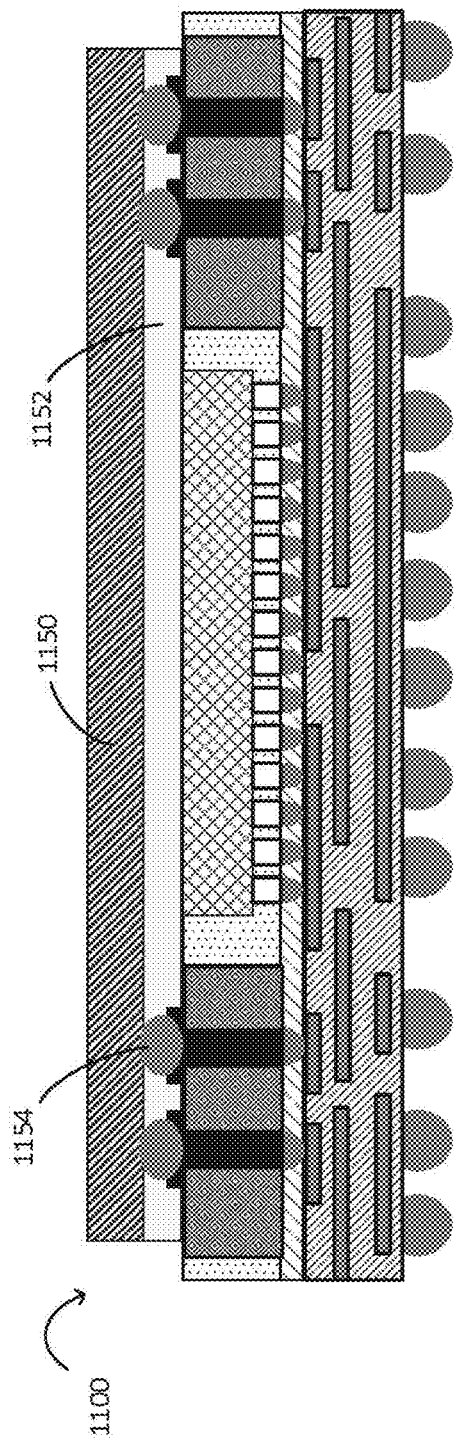
FIG. 11A is a cross-sectional side view of a package-on-package arrangement including a package disposed on a through-via interposer with an embedded die package, in accordance with various embodiments.

FIG. 11A illustrates an assembly 1100 subsequent to stacking or mounting an IC package 1150 on the back side of assembly 900. Stacked IC package 1150 may be coupled to and in electrical contact with assembly 900 by interposer vias 1154. In some embodiments, assembly 1100 may include underfill 1152 to fill the gap between assembly 900 and IC package 1150 surfaces. IC package 1150 may include one or more dies, which may be any suitable component as described above in FIG. 10.

Figure 11B:
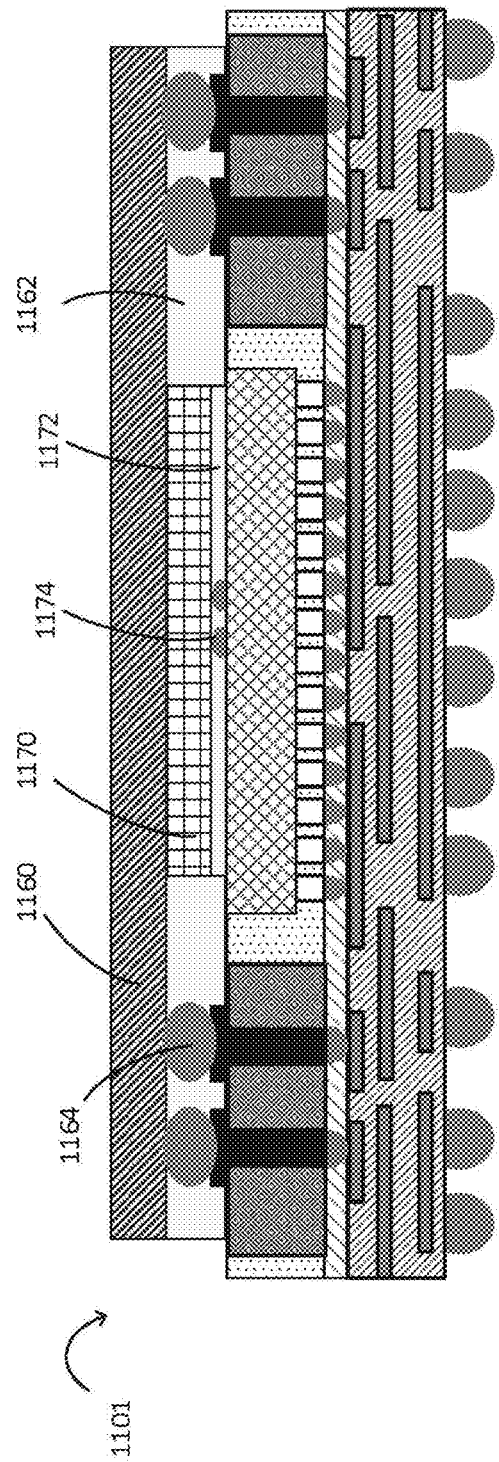
FIG. 11B is a cross-sectional side view of a package-on-package arrangement including a die disposed between a top package and a through-via interposer with an embedded die package, in accordance with various embodiments.

FIG. 11B illustrates an assembly 1101 subsequent to stacking an IC package 1160 on a die 1170 disposed on the back side of assembly 900. IC package 1160 may be coupled to and in electrical contact with interposer vias 1164. In some embodiments, underfill 1162 may be used to fill the gap between the IC package 1160 and die 1170 as well as the through-via interposer with embedded die assembly 900. Die 1170 may be coupled to and in electrical contact with the embedded die via electrical contacts 1174. In some embodiments, underfill 1172 may be used to fill the gap between assembly 900 and die 1170 surfaces. In some embodiments, underfill 1162 and underfill 1172 are the same material. Die 1170 may be any suitable die as described above in FIG. 10. In some embodiments, multiple dies and multiple IC packages may be coupled to the back side of assembly 900, either by stacking or by side-by-side arrangements. In some embodiments, IC package 1160 may be a through-via interposer with embedded die package. In some embodiments, a plurality of through-via interposer with embedded die packages may be disposed (or stacked) on the back side of assembly 900 such that the conductive vias electrically connect the packages.

Figure 12:
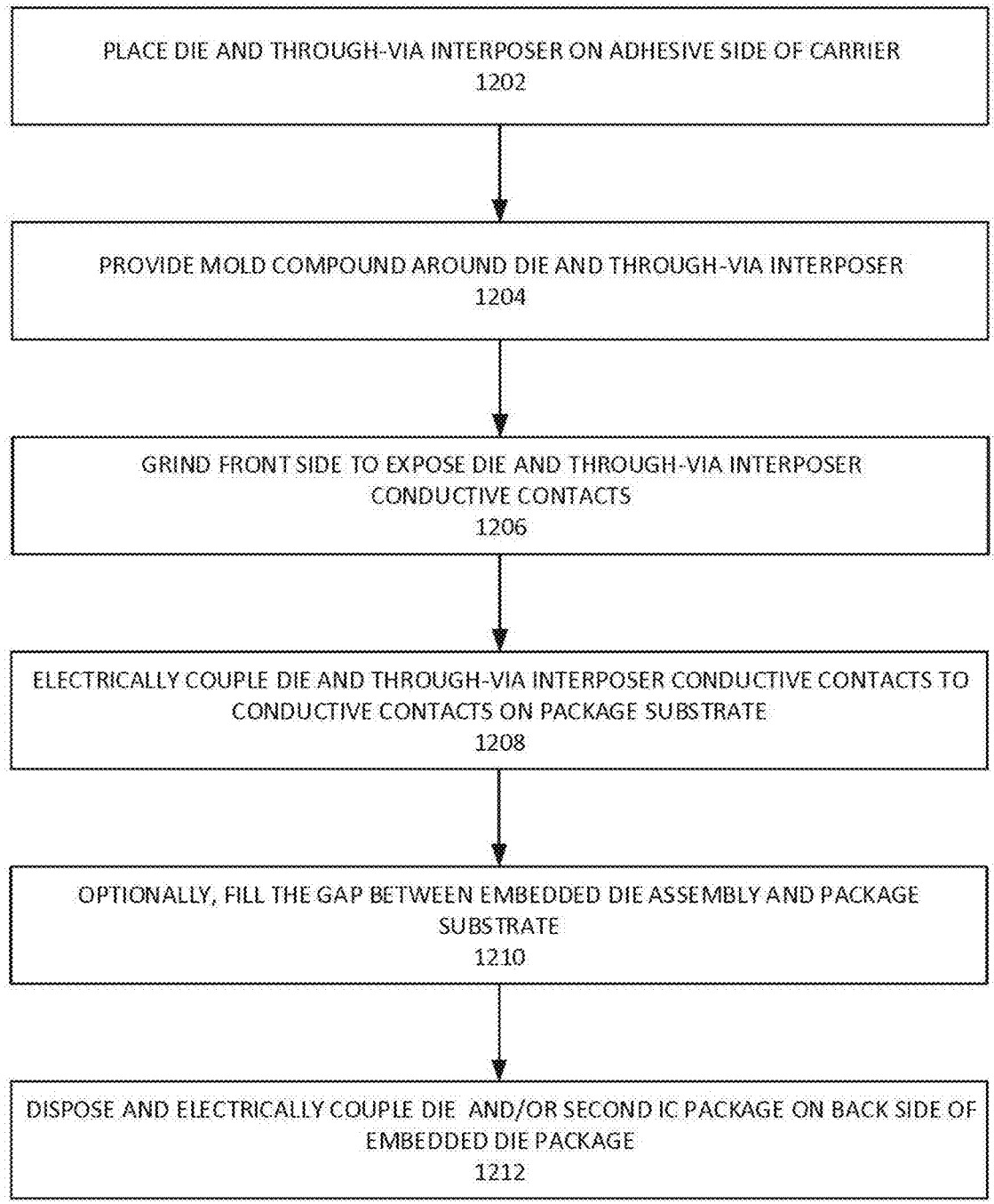
FIG. 12 is a flow diagram of an exemplary method of manufacturing a through-via interposer with an embedded die package, in accordance with various embodiments.

FIG. 12 is a flow diagram of a method 1200 of manufacturing a through-via interposer with embedded die package, in accordance with various embodiments. Although the operations discussed below with reference to FIG. 12 are discussed in a particular order and once each, these operations may be performed multiple times (e.g., in parallel or in series) or in a different order, as appropriate. Additionally, although the operations discussed below with reference to FIG. 12 are illustrated by reference to various ones of the embodiments disclosed herein, the method 1200 may be used to manufacture any suitable through-via interposer with embedded die package.

At 1202, place the back side of a die and a through-via interposer on the adhesive side of a carrier with a releasable adhesive film.

At 1204, provide a mold compound around the die and the through-via interposer.

At 1206, grind the mold compound on the front side to expose the conductive contacts on the die and the interposer.

At 1208, electrically couple the exposed die and interposer conductive contacts to conductive contacts on a package substrate.

At 1210, fill the gap between the through-via interposer and embedded die assembly, and package substrate.

At 1212, electrically couple a die and/or IC package to back side of the through-via interposer with embedded die package.

The through-via interposer with embedded die package, including the stacked die and/or IC package, may be electrically coupled to a motherboard or other device before or after a die and/or an IC package is coupled to the back side.

FIGS. 13-19 illustrate cross-sectional views of various stages in an example process for manufacturing the through-via interposer with embedded die package, in accordance with various embodiments. Although particular techniques are discussed below with reference to FIGS. 13-19, any suitable methods may be used to manufacture embodiments of the through-via interposer with embedded die package. Additionally, although operations discussed below refer to using solder bumps to form electrical connections, any other suitable techniques for electrically coupling may be used including, but are not limited to, thermocompression bonding, thermosonic bonding, or conductive adhesive attachment.

Figure 13:
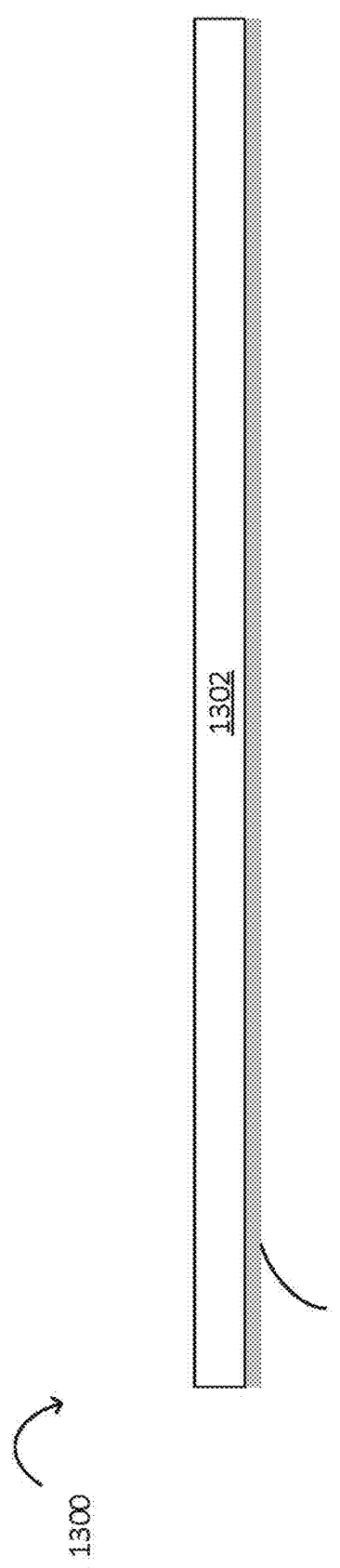

FIG. 13 illustrates an assembly 1300 of a carrier or base plate 1302 with releasable adhesive film 1304. The carrier 1302 and adhesive film 3104 may be of any suitable material, such as described with respect to FIG. 3 above.

Figure 14:
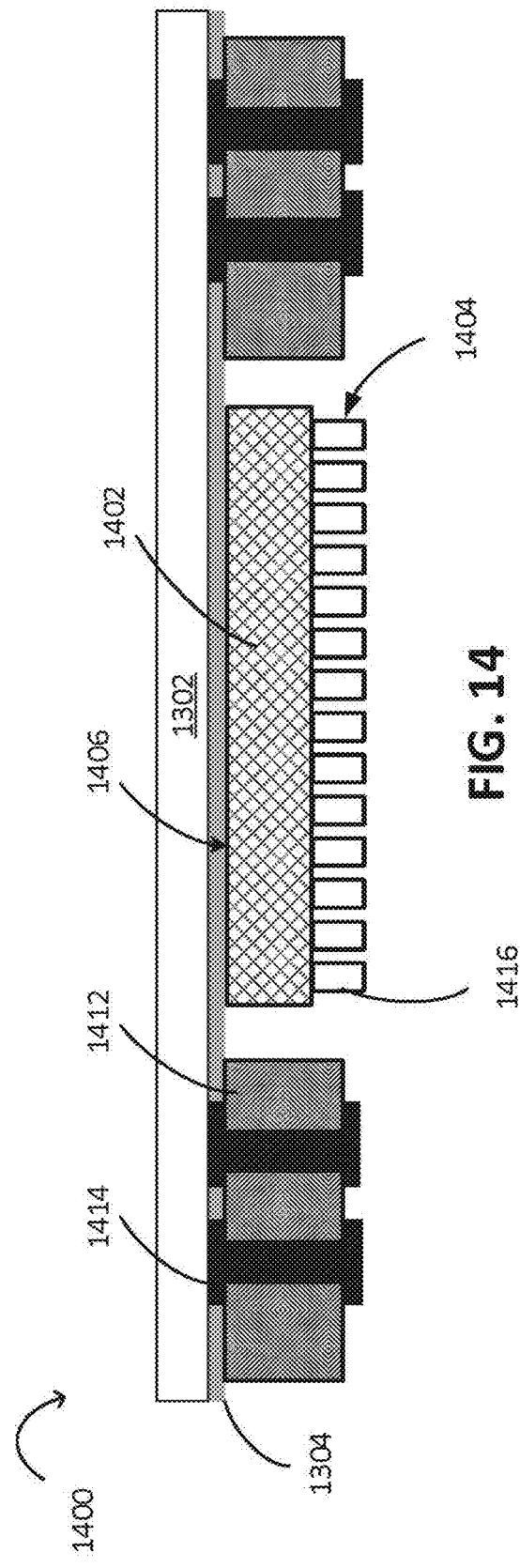

FIG. 14 illustrates an assembly 1400 subsequent to placing die 1402 and interposer 1412 on adhesive side 1304 of assembly 1300. The back side 1406 of die 1402 is disposed against the adhesive side 1304 of assembly 1300 while the active side 1404 with exposed contacts 1416 is on the opposed (bottom) side. The interposer may include one or more conductive vias or pathways. The through-via conductive pathways 1414 may be formed using any suitable through-via formation techniques. In some embodiments, the conductive pathways 1414 may be formed by drilling (e.g., laser drilling) through the interposer material to form openings that may then be filled with a conductive material (e.g., copper). In some embodiments, the conductive pathways 1414 are pre-formed on the interposer 1412. In some embodiments, the through-vias may include multiple layers of conductive wires that are connected by multiple vias. In some embodiments, the interposer 1412 may be a frame that surrounds the die 1402. In some embodiments, the interposer 1412 may be individual bars that are placed to surround the die 1402. The interposer may be any suitable material, such as low-CTE pre-impregnated material, silicon, or glass. In some embodiments, the interposer thickness may be approximately the same thickness as the die, such that the exposed contacts on the die 1416 and the bottom edge of the interposer are aligned.

FIG. 15 illustrates an assembly 1500 subsequent to providing a mold compound 1510 around the die 1402, and the interposer 1412. The mold compound may be added using any suitable technique, such as compression molding from the front side. Although the mold compound 1510 is illustrated in FIG. 15 as fully covering the ends of the conductive vias 1414, in some embodiments, the mold compound may leave the ends of the conductive vias 1414 exposed on the bottom side.

FIG. 16 illustrates an assembly 1600 subsequent to grinding the mold compound 1510 (and the conductive material 1414) of assembly 1500 to expose the contact points of the die 1416 and through-via interposer pads 1614. Grinding operations may include mechanical grinding/polishing, mechanical cutting, and/or chemical mechanical polishing (e.g., CMP).

FIG. 17 illustrates an assembly 1700 subsequent to removing the carrier 1302 and adhesive 1304 from the top side, and subsequent to applying wiring layers 1718 directly on the surface of the die contacts 1416 and the through-via interposer pads 1614. The wiring layers 1718 may be referred to herein as redistribution layers (RDL). The wiring layers 1718 may be added using any suitable technique, such as lithography or plating.

FIG. 18 illustrates an assembly 1800 subsequent to adding dielectric material on the top side (also referred to herein as back side) 1828 and bottom side (also referred to herein as front side, active side, or device side) 1830 of the embedded die assembly. In some embodiments, only a few wiring layers are needed to route the embedded die such that a package substrate may not be used, and assembly 1800 may be the entire through-via interposer with embedded die package. In some embodiments, more wiring layers may be needed to route the embedded die, so assembly 1800 may be coupled to a package substrate, such as package substrate 830 in FIG. 8, to create the entire through-via interposer with embedded die package.

Figure 19:
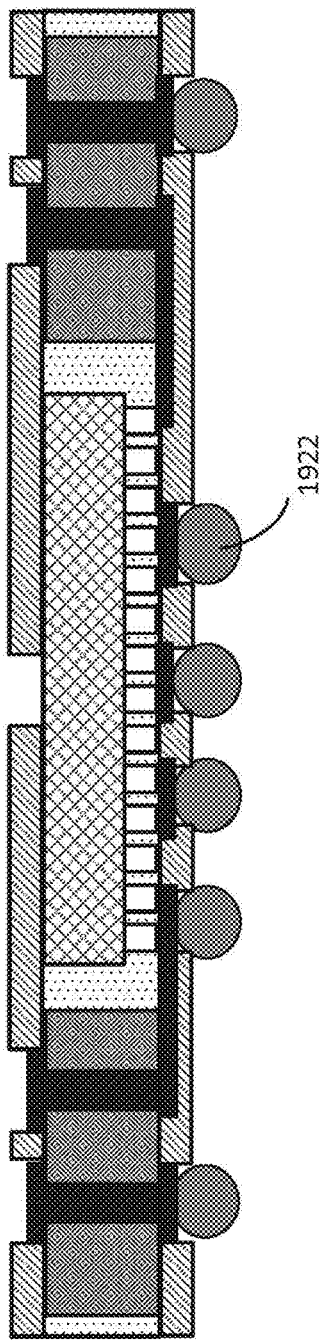

FIG. 19 illustrates an assembly 1900 subsequent to placing and reflowing solder bumps 1922 on the bottom side of packaging substrate for mounting through-via interposer with embedded die package 1900 onto a motherboard or other device.

Figure 20:
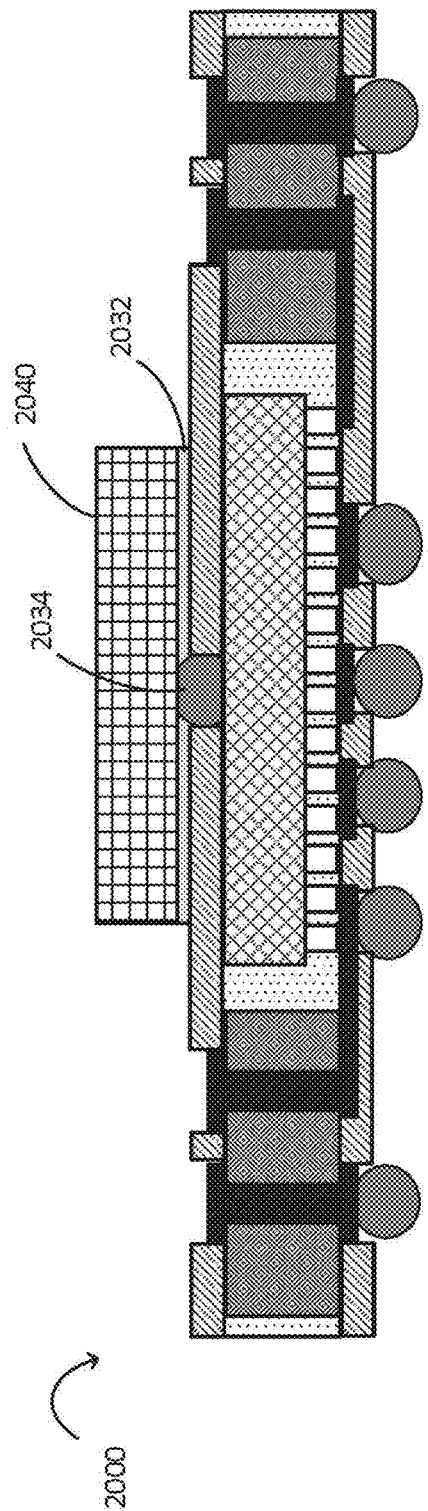
FIG. 20 is a cross-sectional side view of a package-on-package arrangement including a die disposed on a through-via interposer with an embedded die package, in accordance with various embodiments.

FIG. 20 illustrates an assembly 2000 subsequent to mounting a die 2040 on the back side of embedded die 1402. Embedded die 1402 and die 2040 may be coupled and in electrical contact via conductive connection 2034 to enable communication between the components. In some embodiments, die 2040 may be coupled to through-via interposer contacts (not shown). In some embodiments, die 2040 may be coupled by other suitable mechanism (e.g., solder bonds, solder balls, or surface activated bonding). In some embodiments, assembly 2000 may include underfill 2032 to fill the gap between assembly 1900 and die 2040 surfaces. Die 2040 may be any suitable type of die including, for example, a memory die or any other die as described above with respect to FIG. 10. In some embodiment, an IC package may be mounted on the backside of the embedded die package and electrically coupled to one or more conductive vias on the interposer. In some embodiments, a plurality of IC packages may be stacked on the back side of the embedded die package and electrically coupled. In some embodiments, the plurality of stacked IC packages includes through-via interposer embedded die packages that are electrically coupled by the one or more conductive vias.

Figure 21:
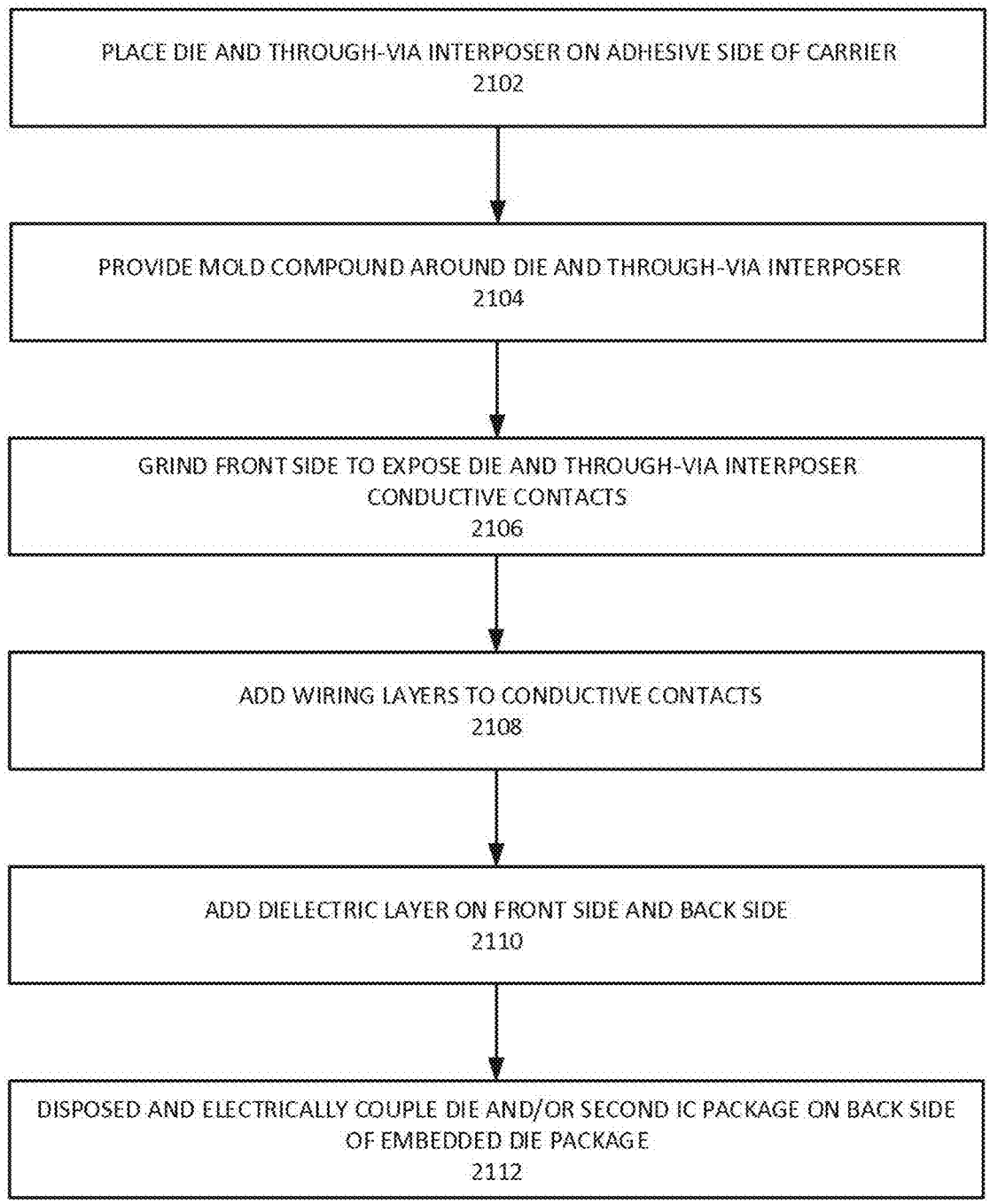
FIG. 21 is a flow diagram of another exemplary method of manufacturing a through-via interposer with an embedded die package, in accordance with various embodiments.

FIG. 21 is a flow diagram of a method 2100 of manufacturing a through-via interposer with embedded die package, in accordance with various embodiments. Although the operations discussed below with reference to FIG. 21 are discussed in a particular order and once each, these operations may be performed multiple times (e.g., in parallel or in series) or in a different order, as appropriate. Additionally, although the operations discussed below with reference to FIG. 21 are illustrated by reference to various ones of the embodiments disclosed herein, the method 2100 may be used to manufacture any suitable through-via interposer with embedded die package.

At 2102, place the back side of a die and a through-via interposer on the adhesive side of a carrier with a releasable adhesive film.

At 2104, provide a mold compound around the die and the through-via interposer.

At 2106, grind the mold compound on the front side of the to expose the conductive contacts on the die and the interposer.

At 2108, add wiring layers on the surface of the exposed conductive contacts on the die and the interposer.

At 2110, add dielectric layer on front side and back side of the through-via interposer and embedded die assembly.

At 1212, electrically couple a die and/or an IC package on the back side of the through-via interposer with embedded die package.

The through-via interposer with embedded die package, including a die and/or an IC package, may be electrically coupled to a motherboard, circuit board, or other device before or after the die and/or the IC package is coupled to the back side.

The through-via interposer with embedded die packages disclosed herein may be included in any suitable electronic device. FIGS. 22-25 illustrate various examples of apparatuses that may be included in, or that may include, one or more of any of the through-via interposer with embedded die packages disclosed herein.

FIGS. 22A-B are top views of a wafer 2200 and dies 2202 that may take the form of any of the embodiments of the through-via interposer with embedded die IC structures 100 disclosed herein. The wafer 2200 may be composed of semiconductor material and may include one or more dies 2202 having IC elements formed on a surface of the wafer 2200. Each of the dies 2202 may be a repeating unit of a semiconductor product that includes any suitable IC. After the fabrication of the semiconductor product is complete, the wafer 2200 may undergo a singulation process in which each of the dies 2202 is separated from one another to provide discrete "chips" of the semiconductor product. The die 2202 may include one or more transistors (e.g., some of the transistors 2340 of FIG. 23, discussed below) and/or supporting circuitry to route electrical signals to the transistors, as well as any other IC components. The die 2202 may include one or more first portions 112a of conductive pathways 112, and thus the die 2202 may be part of a through-via interposer with embedded die IC structure 100. In some embodiments, the wafer 2200 or the die 2202 may include a memory device (e.g., a static random access memory (SRAM) device), a logic device (e.g., an AND, OR, NAND, or NOR gate), or any other suitable circuit element. Multiple ones of these devices may be combined on a single die 2202. For example, a memory array formed by multiple memory devices may be formed on a same die 2202 as a processing device (e.g., the processing device 2502 of FIG. 25) or other logic that is configured to store information in the memory devices or execute instructions stored in the memory array.

FIG. 23 is a cross-sectional side view of an IC device 2300 that may be used with any of the embodiments of the through-via interposer with embedded die IC structures 100 disclosed herein. In particular, one or more of the IC devices 2300 may be included in one or more dies 102. The IC device 2300 may be formed on a substrate 2302 (e.g., the wafer 2200 of FIG. 22A) and may be included in a die (e.g., the die 2202 of FIG. 22B). In some embodiments, the substrate 2302 may provide the IC substrate 130. The substrate 2302 may be a semiconductor substrate composed of semiconductor material systems including, for example, N-type or P-type materials systems. The substrate 2302 may include, for example, a crystalline substrate formed using a bulk silicon or a silicon-on-insulator substructure. In some embodiments, the substrate 2302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2302. Although a few examples of materials from which the substrate 2302 may be formed are described here, any material that may serve as a foundation for an IC device 2300 may be used. The substrate 2302 may be part of a singulated die (e.g., the dies 2202 of FIG. 22B) or a wafer (e.g., the wafer 2200 of FIG. 22A).

The IC device 2300 may include one or more device layers 2304 disposed on the substrate 2302. The device layer 2304 may be included in the circuitry 108 at the device side 104 of the die 102 of the through-via interposer with embedded die IC structures 100. The device layer 2304 may include features of one or more transistors 2340 (e.g., metal oxide semiconductor field-effect transistors (MOSFETs)) formed on the substrate 2302. The device layer 2304 may include, for example, one or more source and/or drain (S/D) regions 2320, a gate 2322 to control current flow in the transistors 2340 between the S/D regions 2320, and one or more S/D contacts 2324 to route electrical signals to/from the S/D regions 2320. The transistors 2340 may include additional features not depicted for the sake of clarity, such as device isolation regions, gate contacts, and the like. The transistors 2340 are not limited to the type and configuration depicted in FIG. 23 and may include a wide variety of other types and configurations such as, for example, planar transistors, nonplanar transistors, or a combination of both. Nonplanar transistors may include FinFET transistors, such as double-gate transistors or tri-gate transistors, and wrap-around or all-around gate transistors, such as nanoribbon and nanowire transistors.

Each transistor 2340 may include a gate 2322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 2340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 2340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2320 may be formed within the substrate 2302 adjacent to the gate 2322 of each transistor 2340. The S/D regions 2320 may be formed using either an implantation/diffusion process or an etching/deposition process, for example. In the former process, dopants such as boron, aluminum, antimony, phosphorous, or arsenic may be ion-implanted into the substrate 2302 to form the S/D regions 2320. An annealing process that activates the dopants and causes them to diffuse farther into the substrate 2302 may follow the ion-implantation process. In the latter process, the substrate 2302 may first be etched to form recesses at the locations of the S/D regions 2320. An epitaxial deposition process may then be carried out to fill the recesses with material that is used to fabricate the S/D regions 2320. In some implementations, the S/D regions 2320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2320 may be formed using one or more alternate semiconductor materials such as germanium or a group III-V material or alloy. In further embodiments, one or more layers of metal and/or metal alloys may be used to form the S/D regions 2320.

Electrical signals, such as power and/or input/output (I/O) signals, may be routed to and/or from the transistors 2340 of the device layer 2304 through one or more interconnect layers disposed on the device layer 2304 (illustrated in FIG. 23 as interconnect layers 2306-2310). For example, electrically conductive features of the device layer 2304 (e.g., the gate 2322 and the S/D contacts 2324) may be electrically coupled with the interconnect structures 2328 of the interconnect layers 2306-2310. The one or more interconnect layers 2306-2310 may form an interlayer dielectric (ILD) stack 2319 of the IC device 2300. The conductive pathways 112 of the double-sided IC structure 100 may extend to, and electrically couple to, one or more of the interconnect layers 2306-2310. The conductive pathways 112 may route signals to/from the devices in the device layer 2304, or may route signals through the interconnect layers 2306-2310 to/from other devices (e.g., other electronic components in a stacked IC structure 200, or other components sharing a circuit board with the IC device 2300).

The interconnect structures 2328 may be arranged within the interconnect layers 2306-2310 to route electrical signals according to a wide variety of designs (in particular, the arrangement is not limited to the particular configuration of interconnect structures 2328 depicted in FIG. 23). Although a particular number of interconnect layers 2306-2310 is depicted in FIG. 23, embodiments of the present disclosure include IC devices having more or fewer interconnect layers than depicted.

In some embodiments, the interconnect structures 2328 may include trench structures 2328a (sometimes referred to as "lines") and/or via structures 2328b (sometimes referred to as "holes") filled with an electrically conductive material such as a metal. The trench structures 2328a may be arranged to route electrical signals in a direction of a plane that is substantially parallel with a surface of the substrate 2302 upon which the device layer 2304 is formed. For example, the trench structures 2328a may route electrical signals in a direction in and out of the page from the perspective of FIG. 23. The via structures 2328b may be arranged to route electrical signals in a direction of a plane that is substantially perpendicular to the surface of the substrate 2302 upon which the device layer 2304 is formed. In some embodiments, the via structures 2328b may electrically couple trench structures 2328a of different interconnect layers 2306-2310 together.

The interconnect layers 2306-2310 may include a dielectric material 2326 disposed between the interconnect structures 2328, as shown in FIG. 23. In some embodiments, the dielectric material 2326 disposed between the interconnect structures 2328 in different ones of the interconnect layers 2306-2310 may have different compositions; in other embodiments, the composition of the dielectric material 2326 between different interconnect layers 2306-2310 may be the same.

A first interconnect layer 2306 (referred to as Metal 1 or "M1") may be formed directly on the device layer 2304. In some embodiments, the first interconnect layer 2306 may include trench structures 2328a and/or via structures 2328b, as shown. The trench structures 2328a of the first interconnect layer 2306 may be coupled with contacts (e.g., the S/D contacts 2324) of the device layer 2304.

A second interconnect layer 2308 (referred to as Metal 2 or "M2") may be formed directly on the first interconnect layer 2306. In some embodiments, the second interconnect layer 2308 may include via structures 2328b to couple the trench structures 2328a of the second interconnect layer 2308 with the trench structures 2328a of the first interconnect layer 2306. Although the trench structures 2328a and the via structures 2328b are structurally delineated with a line within each interconnect layer (e.g., within the second interconnect layer 2308) for the sake of clarity, the trench structures 2328a and the via structures 2328b may be structurally and/or materially contiguous (e.g., simultaneously filled during a dual-damascene process) in some embodiments.

A third interconnect layer 2310 (referred to as Metal 3 or "M3") (and additional interconnect layers, as desired) may be formed in succession on the second interconnect layer 2308 according to similar techniques and configurations described in connection with the second interconnect layer 2308 or the first interconnect layer 2306.

The IC device 2300 may include a solder resist material 2334 (e.g., polyimide or similar material) and one or more bond pads 2336 formed on the interconnect layers 2306-2310. The bond pads 2336 may provide the contacts to couple to the first level interconnects, for example. The bond pads 2336 may be electrically coupled with the interconnect structures 2328 and configured to route the electrical signals of the transistor(s) 2340 to other external devices. For example, solder bonds may be formed on the one or more bond pads 2336 to mechanically and/or electrically couple a chip including the IC device 2300 with another component (e.g., a circuit board). The IC device 2300 may have other alternative configurations to route the electrical signals from the interconnect layers 2306-2310 than depicted in other embodiments. For example, the bond pads 2336 may be replaced by or may further include other analogous features (e.g., posts) that route the electrical signals to external components.

Figure 24:
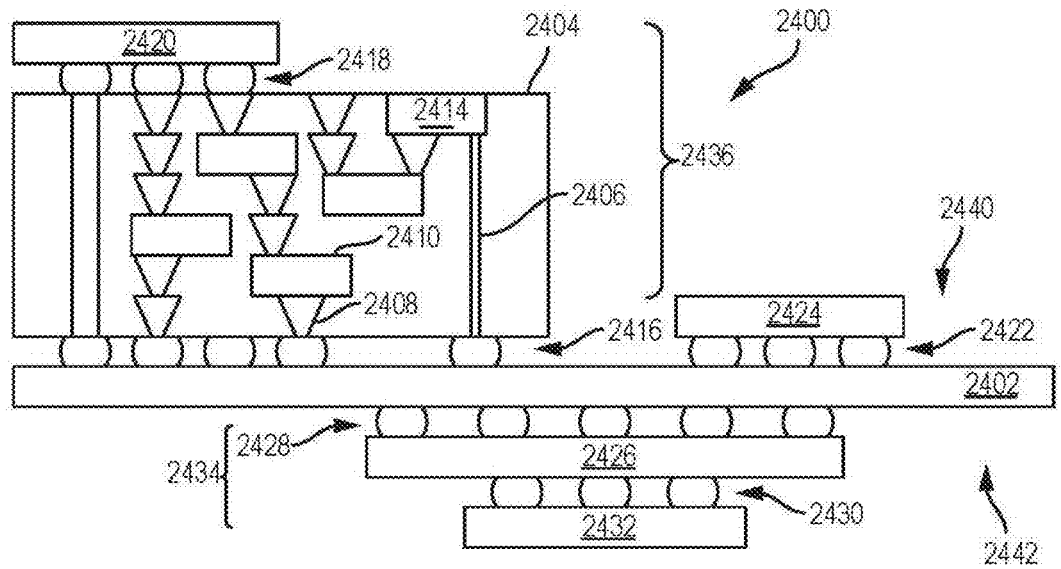
FIG. 24 is a cross-sectional side view of an IC device assembly that may include any of the embodiments of the packages disclosed herein.

FIG. 24 is a cross-sectional side view of an IC device assembly 2400 that may include any of the embodiments of the through-via interposer with embedded die IC structures 100 disclosed herein. The IC device assembly 2400 includes a number of components disposed on a circuit board 2402 (which may be, e.g., a motherboard). The IC device assembly 2400 includes components disposed on a first face 2440 of the circuit board 2402 and an opposing second face 2442 of the circuit board 2402; generally, components may be disposed on one or both faces 2440 and 2442.

In some embodiments, the circuit board 2402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2402. In other embodiments, the circuit board 2402 may be a non-PCB substrate.

The IC device assembly 2400 illustrated in FIG. 24 includes a package-on-interposer structure 2436 coupled to the first face 2440 of the circuit board 2402 by coupling components 2416. The coupling components 2416 may electrically and mechanically couple the package-on-interposer structure 2436 to the circuit board 2402, and may include solder balls (as shown in FIG. 24), male and female portions of a socket, an adhesive, an underfill material, and/or any other suitable electrical and/or mechanical coupling structure.

The package-on-interposer structure 2436 may include an electronics package 2420 coupled to an interposer 2404 by coupling components 2418. The coupling components 2418 may take any suitable form for the application, such as the forms discussed above with reference to the coupling components 2416. Although a single electronics package 2420 is shown in FIG. 24, multiple electronics packages may be coupled to the interposer 2404; indeed, additional interposers may be coupled to the interposer 2404. The interposer 2404 may provide an intervening substrate used to bridge the circuit board 2402 and the electronics package 2420. The electronics package 2420 may be or include, for example, a die (the die 2202 of FIG. 22B), an IC device (e.g., the IC device 2300 of FIG. 23), or any other suitable component. Generally, the interposer 2404 may spread a connection to a wider pitch or reroute a connection to a different connection. For example, the interposer 2404 may couple the electronics package 2420 (e.g., a die) to a ball grid array (BGA) of the coupling components 2416 for coupling to the circuit board 2402. In the embodiment illustrated in FIG. 24, the electronics package 2420 and the circuit board 2402 are attached to opposing sides of the interposer 2404; in other embodiments, the electronics package 2420 and the circuit board 2402 may be attached to a same side of the interposer 2404. In some embodiments, three or more components may be interconnected by way of the interposer 2404. In some embodiments, the electronics package 2420 may include a through-via interposer with embedded die IC structure 100 (e.g., the electronics package 2420 may take the form of the double-sided package 202). For example, an additional electronic component may be disposed on the electronics package 2420 to form a stacked IC structure.

The interposer 2404 may be formed of an epoxy resin, a fiberglass-reinforced epoxy resin, a ceramic material, or a polymer material such as polyimide. In some embodiments, the interposer 2404 may be formed of alternate rigid or flexible materials that may include the same materials described above for use in a semiconductor substrate, such as silicon, germanium, and other group III-V and group IV materials. The interposer 2404 may include metal interconnects 2408 and vias 2410, including but not limited to through-silicon vias (TSVs) 2406. The interposer 2404 may further include embedded devices 2414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2404. The package-on-interposer structure 2436 may take the form of any of the package-on-interposer structures known in the art.

The IC device assembly 2400 may include an electronics package 2424 coupled to the first face 2440 of the circuit board 2402 by coupling components 2422. The coupling components 2422 may take the form of any of the embodiments discussed above with reference to the coupling components 2416, and the electronics package 2424 may take the form of any of the embodiments discussed above with reference to the electronics package 2420. In some embodiments, the electronics package 2424 may include a through-via interposer with embedded die IC structure 100 (e.g., the electronics package 2424 may take the form of the through-via interposer with embedded die package).

The IC device assembly 2400 illustrated in FIG. 24 includes a package-on-package structure 2434 coupled to the second face 2442 of the circuit board 2402 by coupling components 2428. The package-on-package structure 2434 may include an electronics package 2426 and an electronics package 2432 coupled together by coupling components 2430 such that the electronics package 2426 is disposed between the circuit board 2402 and the electronics package 2432. The package-on-package structure 2434 may take the form of the stacked IC structure 200 (e.g., the electronics package 2426 may be a double-sided package 202). The coupling components 2428 and 2430 may take the form of any of the embodiments of the coupling components 2416 discussed above, and the electronics packages 2426 and 2432 may take the form of any of the embodiments of the electronics package 2420 discussed above.

Figure 25:
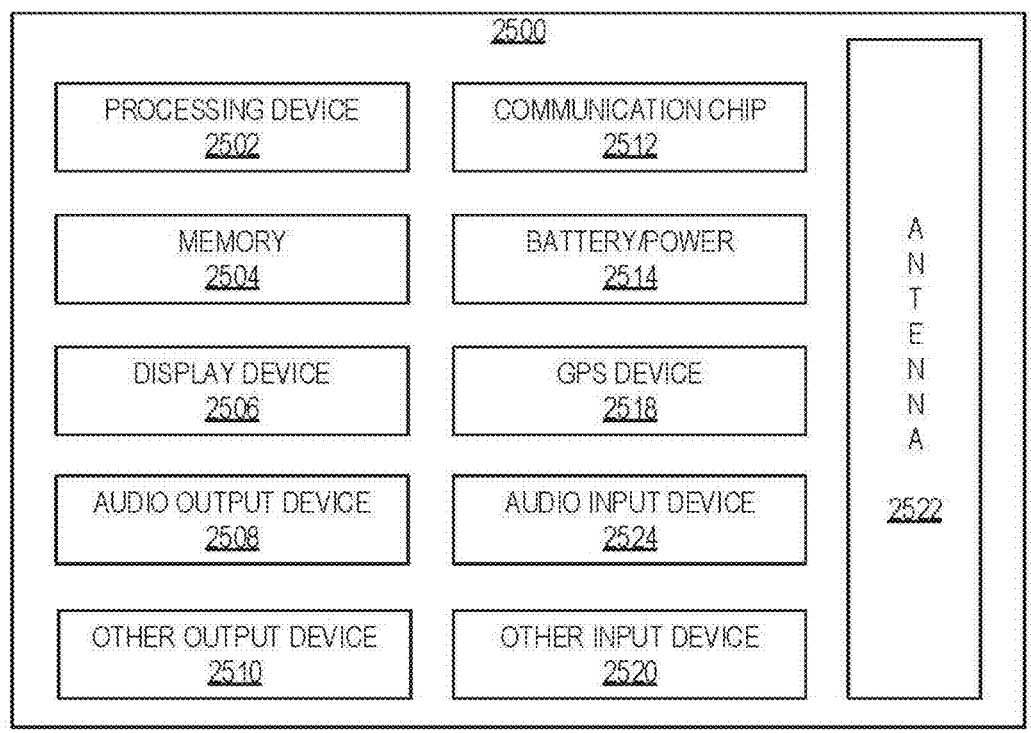
FIG. 25 is a block diagram of an example computing device that may include any of the embodiments of the packages disclosed herein.

FIG. 25 is a block diagram of an example computing device 2500 that may include one or more of any of the embodiments of the through-via interposer with embedded die IC structures 100 disclosed herein. For example, any suitable ones of the components of the computing device 2500 may include, or be included in, a through-via interposer with embedded die IC structure 100, in accordance with any of the embodiments disclosed herein. A number of components are illustrated in FIG. 25 as included in the computing device 2500, but any one or more of these components may be omitted or duplicated, as suitable for the application. In some embodiments, some or all of the components included in the computing device 2500 may be attached to one or more motherboards. In some embodiments, some or all of these components are fabricated onto a single system-on-a-chip (SoC) die.

Additionally, in various embodiments, the computing device 2500 may not include one or more of the components illustrated in FIG. 25, but the computing device 2500 may include interface circuitry for coupling to the one or more components. For example, the computing device 2500 may not include a display device 2506, but may include display device interface circuitry (e.g., a connector and driver circuitry) to which a display device 2506 may be coupled. In another set of examples, the computing device 2500 may not include an audio input device 2524 or an audio output device 2508, but may include audio input or output device interface circuitry (e.g., connectors and supporting circuitry) to which an audio input device 2524 or audio output device 2508 may be coupled.

The computing device 2500 may include a processing device 2502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2500 may include a memory 2504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2504 may include memory that shares a die with the processing device 2502. This memory may be used as cache memory and may include embedded dynamic random access memory (eDRAM) or spin transfer torque magnetic random-access memory (STT-MRAM).

In some embodiments, the computing device 2500 may include a communication chip 2512 (e.g., one or more communication chips). For example, the communication chip 2512 may be configured for managing wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2512 may implement any of a number of wireless standards or protocols, including but not limited to Institute for Electrical and Electronic Engineers (IEEE) standards including Wi-Fi (IEEE 2302.11 family), IEEE 2302.16 standards (e.g., IEEE 2302.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 2302.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 2302.16 standards. The communication chip 2512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2512 may operate in accordance with other wireless protocols in other embodiments. The computing device 2500 may include an antenna 2522 to facilitate wireless communications and/or to receive other wireless communications (such as AM or FM radio transmissions).

In some embodiments, the communication chip 2512 may manage wired communications, such as electrical, optical, or any other suitable communication protocols (e.g., the Ethernet). As noted above, the communication chip 2512 may include multiple communication chips. For instance, a first communication chip 2512 may be dedicated to shorter-range wireless communications such as Wi-Fi or Bluetooth, and a second communication chip 2512 may be dedicated to longer-range wireless communications such as GPS, EDGE, GPRS, CDMA, WiMAX, LTE, EV-DO, or others. In some embodiments, a first communication chip 2512 may be dedicated to wireless communications, and a second communication chip 2512 may be dedicated to wired communications.

The computing device 2500 may include battery/power circuitry 2514. The battery/power circuitry 2514 may include one or more energy storage devices (e.g., batteries or capacitors) and/or circuitry for coupling components of the computing device 2500 to an energy source separate from the computing device 2500 (e.g., AC line power).

The computing device 2500 may include a display device 2506 (or corresponding interface circuitry, as discussed above). The display device 2506 may include any visual indicators, such as a heads-up display, a computer monitor, a projector, a touchscreen display, a liquid crystal display (LCD), a light-emitting diode display, or a flat panel display, for example.

The computing device 2500 may include an audio output device 2508 (or corresponding interface circuitry, as discussed above). The audio output device 2508 may include any device that generates an audible indicator, such as speakers, headsets, or earbuds, for example.

The computing device 2500 may include an audio input device 2524 (or corresponding interface circuitry, as discussed above). The audio input device 2524 may include any device that generates a signal representative of a sound, such as microphones, microphone arrays, or digital instruments (e.g., instruments having a musical instrument digital interface (MIDI) output).

The computing device 2500 may include a global positioning system (GPS) device 2518 (or corresponding interface circuitry, as discussed above). The GPS device 2518 may be in communication with a satellite-based system and may receive a location of the computing device 2500, as known in the art.

The computing device 2500 may include an other output device 2510 (or corresponding interface circuitry, as discussed above). Examples of the other output device 2510 may include an audio codec, a video codec, a printer, a wired or wireless transmitter for providing information to other devices, or an additional storage device.

The computing device 2500 may include an other input device 2520 (or corresponding interface circuitry, as discussed above). Examples of the other input device 2520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2500 may be any other electronic device that processes data.

EXAMPLES

The following paragraphs provide various examples of the embodiments disclosed herein.

Example 1 is an integrated circuit (IC) package, including: an interposer having one or more conductive through-vias; a die having a device side and an opposing back side; a mold compound; and a package substrate, wherein the die is embedded in the interposer and is electrically coupled to the package substrate and wherein the mold compound is in contact with the die.

Example 2 may include the subject matter of Example 1, and may further include a die disposed on the back side of the IC package.

Example 3 may include the subject matter of Example 2, and may further specify that the die disposed on the back side of the IC package is electrically coupled to the embedded die of the IC package.

Example 4 may include the subject matter of Example 2, and may further specify that the die disposed on the back side of the IC package is electrically coupled to the one or more conductive through-vias in the interposer.

Example 5 may include the subject matter of Example 2, and may further specify that the die disposed on the back side of the IC package is a memory die.

Example 6 may include the subject matter of Example 1, and may further include a second IC package disposed on the back side of the first IC package.

Example 7 may include the subject matter of Example 6, and may further specify that the second IC package disposed on the back side of the first IC package is electrically coupled to the embedded die of the first IC package.

Example 8 may include the subject matter of Example 6, and may further specify that the second IC package disposed on the back side of the first IC package is electrically coupled to the one or more conductive through-vias in the interposer.

Example 9 may include the subject matter of Example 6, and may further specify that the second IC package includes: a second interposer having one or more conductive through-vias; a second die having a device side and an opposing back side; a second mold compound; and a second package substrate, wherein the second die is embedded in the second interposer and is electrically coupled to the package substrate and wherein the second mold compound is in contact with the second die.

Example 10 may include the subject matter of Example 9, and may further include: a third die, wherein the third die is disposed between the first IC package and the second IC package, and wherein the third die is electrically coupled to the embedded die of the first IC package.

Example 11 may include the subject matter of Example 9, and may further include: a third IC package disposed on top of the second IC package, wherein the third IC package is electrically coupled to the one or more conductive through-vias in the interposer of the second IC package.

Example 12 may include the subject matter of Example 1, and may further include: a wiring layer on the device side; a dielectric layer on the device side; and a dielectric layer on the back side.

Example 13 may include the subject matter of Example 1, and may further specify that the interposer material and the package substrate material have a similar coefficient of thermal expansion.

Example 14 is a method of manufacturing an integrated circuit (IC) package, including: placing a back side of a die on an adhesive side of a carrier with a releasable adhesive film; placing an interposer around the die, wherein the interposer has one or more conductive through-vias; providing a mold compound around the die and the interposer; grinding the mold compound on the device side to expose the conductive contacts on the die and the interposer; and electrically coupling the exposed conductive contacts on the die and the interposer to a package substrate.

Example 15 may include the subject matter of Example 14, and may further include: disposing a die on the back side of the IC package; and electrically coupling the die on the back side of the IC package to the embedded die of the IC package.

Example 16 may include the subject matter of Example 15, and may further include: disposing a second die on the back side of the first die on the back side of the IC package; and electrically coupling the second die to the first die.

Example 17 may include the subject matter of Example 15, and may further include: disposing a second IC package on the back side of the die on the backside of the first IC package; and electrically coupling the second IC package to the one or more conductive through-vias on the first IC package.

Example 18 may include the subject matter of Example 14, and may further include: disposing a second IC package on the back side of the first IC package; and electrically coupling the second IC package to the one or more conductive through-vias on the first IC package.

Example 19 may include the subject matter of Example 14, and may further include: adding a wire layer on the exposed conductive contacts on the die and the interposer before electrically coupling to the package substrate; and adding a dielectric layer on the device side and on the backside before electrically coupling to the package substrate.

Example 20 may include the subject matter of any of Examples 14-19, and may further include: electrically coupling the package substrate to a circuit board.

Example 21 is a computing device, including: a circuit board; and an IC package coupled to the circuit board, wherein the IC package includes: an interposer having one or more conductive through-vias; a die having a device side and an opposing back side; a mold compound; and a package substrate, wherein the die is embedded in the interposer and is electrically coupled to the package substrate and wherein the mold compound is in contact with the die.

Example 22 may include the subject matter of Example 21, and may further include: a die disposed on the back side of the IC package.

Example 23 may include the subject matter of Example 22, and may further specify that the die disposed on the back side of the IC package is electrically coupled to the embedded die of the IC package.

Example 24 may include the subject matter of Example 22, and may further specify that the die disposed on the back side of the IC package is electrically coupled to the one or more conductive through-vias in the interposer.

Example 25 may include the subject matter of Example 22, and may further specify that the die disposed on the back side of the IC package is a memory die.

Example 26 may include the subject matter of Example 21, and may further include: a second IC package disposed on the back side of the first IC package.

Example 27 may include the subject matter of Example 26, and may further specify that the second IC package disposed on the back side of the first IC package is electrically coupled to the embedded die of the first IC package.

Example 28 may include the subject matter of Example 26, and may further specify that the second IC package disposed on the back side of the first IC package is electrically coupled to the one or more conductive through-vias in the interposer.

Example 29 may include the subject matter of Example 26, and may further specify that the second IC package includes: a second interposer having one or more conductive through-vias; a second die having a device side and an opposing back side; a second mold compound; and a second package substrate, wherein the second die is embedded in the second interposer and is electrically coupled to the package substrate and wherein the second mold compound is in contact with the second die.

Example 30 may include the subject matter of any of Examples 26-29, and may further include: a third die, wherein the third die is disposed between the first IC package and the second IC package, and wherein the third die is electrically coupled to the embedded die of the first IC package.

Example 31 may include the subject matter of any of Examples 26-29, and may further include: a third IC package disposed on top of the second IC package, wherein the third IC package is electrically coupled to the one or more conductive through-vias in the interposer of the second IC package.

Example 32 may include the subject matter of any of Examples 21-31, and may further include: a wiring layer on the device side; a dielectric layer on the device side; and a dielectric layer on the back side.

Example 33 may include the subject matter of any of Examples 21-31, and may further specify that the interposer material and the package substrate material have a similar coefficient of thermal expansion.

Example 34 is an IC package, including: an interposer having one or more conductive through-vias; a die having a device side and an opposing back side; a mold compound; a wiring layer on the device side; a dielectric layer on the device side; and a dielectric layer on the back side, wherein the die is embedded in the interposer and is electrically coupled to the wiring layer and wherein the mold compound is in contact with the die.

Example 35 may include the subject matter of Example 34, and may further include: a die disposed on the back side of the IC package, wherein the die disposed on the back side of the IC package is electrically coupled to the embedded die of the IC package.

Example 36 may include the subject matter of Example 34, and may further include: a second IC package disposed on the back side of the first IC package, wherein the second IC package disposed on the back side of the first IC package is electrically coupled to the one or more conductive through-vias.

Example 37 may include the subject matter of Example 36, and may further specify that the second IC package includes: a second interposer having one or more conductive through-vias; a second die having a device side and an opposing back side; a second mold compound; a second wiring layer on the device side; a second dielectric layer on the device side; and a second dielectric layer on the back side, wherein the second die is embedded in the second interposer and is electrically coupled to the second wiring layer and wherein the second mold compound is in contact with the second die.

Example 38 is a method of manufacturing an integrated circuit (IC) package, including: placing a back side of a die on an adhesive side of a carrier with a releasable adhesive film; placing an interposer around the die, wherein the interposer has one or more conductive through-vias in the interposer; providing a mold compound around the die and the interposer; grinding the mold compound on the device side to expose the conductive contacts on the die and the interposer; adding a wire layer to the exposed conductive contacts on the die and the interposer; adding a dielectric layer on the device side; and adding a dielectric layer on the back side.

Example 39 may include the subject matter of Example 38, and may further include: disposing a die on the back side of the IC package; and electrically coupling the die to the embedded die of the IC package.

Example 40 may include the subject matter of Example 38, and may further include: disposing a second IC package on the back side of the IC package; and electrically coupling the second IC package to the one or more conductive through-vias.

The invention claimed is:

1. An assembly, comprising:
   an interposer above circuitry, the circuitry comprising traces;
   a first die above the circuitry, the first die laterally adjacent to the interposer, the first die having a top side and a bottom side, the top side opposite the bottom side, and the first die having a first lateral sidewall and a second lateral sidewall;
   a mold compound laterally adjacent to the first and second lateral sidewalls of the die and beneath the bottom side of the die, the mold compound in contact with the interposer;
   a package above the interposer and the first die, the package including a second die;
   a gap between the package and the first die;
   an underfill material completely filling the gap between the package and the first die, the underfill material between the package and the mold compound, and the underfill material between the package and the interposer; and
   an interposer via electrically coupling the package to the interposer, the interposer via having a bottom surface above the top side of the first die.

2. The assembly of claim 1, wherein the interposer is a through-via interposer.

3. The assembly of claim 1, wherein the circuitry is included in a package substrate.

4. The assembly of claim 1, wherein the circuitry comprises a die side and a side opposite the die side, the side opposite the die side coupled to one or more solder balls.

5. The assembly of claim 1, wherein the package comprises a third die.

6. The assembly of claim 5, wherein the first die is a processor die.

7. The assembly of claim 6, wherein the second die is a memory die.

8. The assembly of claim 1, wherein the second die is a memory die.

9. An assembly, comprising:
   an interposer above one or more redistribution layers;
   a first die above the one or more redistribution layers, the first die laterally adjacent to the interposer, the first die having a top side and a bottom side, the top side opposite the bottom side, and the first die having a first lateral sidewall and a second lateral sidewall;
   a mold compound laterally adjacent to the first and second lateral sidewalls of the die and beneath the bottom side of the die, the mold compound in contact with the interposer;
   an interposer via having a bottom surface above the top side of the first die;
   a second die above the top side of the first die, the second die electrically coupled to the interposer via;
   a gap between the second die and the first die;
   an underfill material completely filling the gap between the first die and the second die; and
   one or more solder balls coupled to the one or more redistribution layers.

10. The assembly of claim 9, wherein the interposer is a through-via interposer.

11. The assembly of claim 9, wherein the first die is a processor die.

12. The assembly of claim 11, wherein the second die is a memory die.

13. The assembly of claim 9, wherein the second die is a memory die.

14. The assembly of claim 9, wherein the mold compound comprises a material selected from the group consisting of a polymer compound, a poly-resin mold compound, and an elastomer mold compound.

* * * * *